(12) United States Patent
Fairey

(10) Patent No.: US 10,020,006 B2
(45) Date of Patent: *Jul. 10, 2018

(54) SYSTEMS AND METHODS FOR SPEECH PROCESSING COMPRISING ADJUSTMENT OF HIGH FREQUENCY ATTACK AND RELEASE TIMES

(71) Applicant: Yobe, Inc., St. James, NY (US)

(72) Inventor: James Christopher Fairey, Mariett, MD (US)

(73) Assignee: Yobe, Inc., St. James, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/243,688

(22) Filed: Aug. 22, 2016

(65) Prior Publication Data
US 2017/0047081 A1 Feb. 16, 2017

Related U.S. Application Data

(63) Continuation of application No. 13/603,767, filed on Sep. 5, 2012, now Pat. No. 9,449,612, which is a
(Continued)

(51) Int. Cl.
G10L 21/00 (2013.01)
G10L 21/02 (2013.01)
H03G 3/00 (2006.01)
G10L 21/0364 (2013.01)
G10L 21/0208 (2013.01)
G10L 25/81 (2013.01)
(Continued)

(52) U.S. Cl.
CPC ...... *G10L 21/0364* (2013.01); *G10L 21/0208* (2013.01); *G10L 25/81* (2013.01); *H03G 5/005* (2013.01); *H03G 5/22* (2013.01)

(58) Field of Classification Search
CPC .............................. H03G 5/22; G10L 21/0208
USPC .......................................................... 381/107
See application file for complete search history.

(56) References Cited

U.S. PATENT DOCUMENTS 6,868,162 B1 * 3/2005 Jubien ...................... H03G 5/22
381/107
6,990,194 B2 1/2006 Mikesell
(Continued)

*Primary Examiner* — Farzad Kazeminezhad
(74) *Attorney, Agent, or Firm* — Sheppard, Mullin, Richter and Hampton, LLP; Jesse Salen; Daniel Yannuzzi

(57) ABSTRACT

Systems and methods described herein modify audio content on an electronic device. Embodiments can be configured to detect a mode of the electronic device to determine whether the device is in a telephone mode; receive a speech signal from a speech source while the device is in the telephone mode; and process the speech signal to improve the perceived quality of the speech at a recipient when the electronic device is in a telephone mode; wherein processing the speech signal to improve the perceived quality of the speech comprises, decreasing the signal level of audio content outside of a determined frequency band relative to the signal level of the audio content within the determined frequency band; and wherein the determined frequency band is a frequency band associated a vocal range of the anticipated speech content. The method further includes adjusting high frequency sounds such as attack and release times of the speech signal based on sound events within the speech signal.

21 Claims, 14 Drawing Sheets

Related U.S. Application Data continuation-in-part of application No. 13/488,012, filed on Jun. 4, 2012, which is a continuation of application No. 13/425,038, filed on Mar. 20, 2012, which is a continuation-in-part of application No. PCT/US2011/034142, filed on Apr. 27, 2011.

(60) Provisional application No. 61/328,342, filed on Apr. 27, 2010, provisional application No. 61/388,220, filed on Sep. 30, 2010, provisional application No. 61/413,204, filed on Nov. 12, 2010.

(51) Int. Cl.
*H03G 5/00* (2006.01)
*H03G 5/22* (2006.01)

(56) References Cited

U.S. PATENT DOCUMENTS

| | | |
|---|---|---|
| 7,123,728 B2 | 10/2006 | King |
| 2003/0101050 A1* | 5/2003 | Khalil ............... G10L 19/22 |
| | | 704/216 |
| 2005/0240401 A1 | 10/2005 | Ebenezer |

* cited by examiner

SYSTEMS AND METHODS FOR SPEECH PROCESSING COMPRISING ADJUSTMENT OF HIGH FREQUENCY ATTACK AND RELEASE TIMES

CROSS-REFERENCE TO RELATED APPLICATIONS

This application is a continuation of U.S. patent application Ser. No. 13/603,767, which is a continuation-in part of U.S. patent application Ser. No. 13/488,012, which is a continuation of U.S. patent application Ser. No. 13/425,038, which is a continuation-in-part of International Application PCT/US2011/034142, filed 27 Apr. 2011, which in turn claims the benefit of U.S. Provisional Patent Application No. 61/328,342, filed 27 Apr. 2010, and entitled "Sound Wave Modification;" U.S. Provisional Patent Application No. 61/388,220, filed 30 Sep. 2010, and entitled, "Device for Sound Wave Modification;" and U.S. Provisional Patent Application No. 61/413,204, filed 12 Nov. 2010, and entitled "Location Enabled Headset" each of which are incorporated by reference as if set forth herein in their entireties.

U.S. patent application Ser. No. 13/603,767 is also a continuation-in part of U.S. patent application Ser. No. 13/488,035, which is a continuation of U.S. patent application Ser. No. 13/425,025, which is a continuation-in-part of International Application PCT/US2011/034142, filed 27 Apr. 2011, which in turn claims the benefit of U.S. Provisional Patent Application No. 61/328,342, filed 27 Apr. 2010, and entitled "Sound Wave Modification;" U.S. Provisional Patent Application No. 61/388,220, filed 30 Sep. 2010, and entitled, "Device for Sound Wave Modification;" and U.S. Provisional Patent Application No. 61/413,204, filed 12 Nov. 2010, and entitled "Location Enabled Headset" each of which are incorporated by reference as if set forth herein in their entireties.

This application is related to U.S. Pat. No. 8,964,993, entitled "Systems and Methods for Enhancing Audio Content," which is hereby incorporated by reference in its entirety.

TECHNICAL FIELD

The present invention relates generally to audio content, and more particularly, some embodiments relate to systems and methods for enhancing the sound quality of electronic audio files or electronic audio communication.

DESCRIPTION OF THE RELATED ART

Since the advent of audio recording, audio engineers have strived to improve the quality of audio reproduction attainable. From regular or casual listeners, to Audiophiles, to forensic audio analysts, users of recorded audio products have demanded improved quality for audio files. Whether extracting a specific audio signal from a noisy file or improving the overall 'richness' of an audio recording, audio engineers have worked to manipulate sound components in audio content to achieve desired results.

For example, when playing an audio recording, whether through a headset with two speakers (a left and right earpiece) or from a home stereo with multi-speaker surround-sound capabilities (e.g., Dolby® 5.1 or 7.1 Surround), a desired effect is to create a "rich" or immersive feel to the music. For systems that use more than two speakers placed around the listening position, this is achieved by separating the sound into multiple channels and porting those channels to the separate speakers. For example, in a 5.1 surround sound system, there are typically 6 speakers, a center speaker, a subwoofer, two front speakers (left and right) and two rear speakers (left and right). Thus, when the listener is sitting in an appropriate location, the speakers are properly aligned and the amplifiers calibrated, the listener, instead of hearing only left and right sounds will experience a surround sound effect. The sounds will approach the listener from the front and rear left and right as well as the center.

Sound waves are compression waves that interact with the eardrum. It is generally believed that in order to detect the location of various sounds, the brain processes sound waves to determine time and amplitude differences of the sound received at the listener's ears. For example, to determine the location of a sound at generally lower frequencies, the brain, it is thought, measures the temporal difference between the arrival time of the sound at the two ear drums and processes the sound location according to that difference. It likely this reason that, when trying to location the direction of a low amplitude sound, a person will typically rotate their head (and thus ears) to increase the amount of information provided to the brain to locate the sound. Recent research indicates that, at higher frequencies, though, it is contemplated that the brain uses the amplitude of the sound in the ears as the location information source.

BRIEF SUMMARY OF EMBODIMENTS OF THE INVENTION

In accordance with an aspect of the systems and methods described herein, ways in which audio files may be modified are disclosed. In some embodiments, the audio files are modified to increase the richness or immersive feel of the sound waves produced therefrom. That is, the files are modified to provide sound from two stereo speakers that simulate a surround sound or three-dimensional input. Although the resultant sound waves may be most appreciated when used with a headset or a device having only two speakers (a left and right channel), the systems and methods described herein may also be used with a device having any number of speakers. Further, although the following description is applied to a sound signal for playback having a left and right channel, it is contemplated and should be understood to be within the scope of the systems and methods described herein that the same modification may be applied to a sound signal having more than two channels, whether they are played back using a two speaker system or more than two speaker system.

According to an embodiment of the systems and methods described herein, a device is configured to modify characteristics of an audio file such as, for example, a two-channel audio file. The device is configured with a first control that modifies the gain of the audio content at various frequencies as well as a second control (which may incorporated into the first control or used as a separate control) that modifies the gain of the audio content at various frequencies.

To that effect, a sound signal having a left and right channel may be modified in at least two ways to generate a surround or three-dimensional sound to the listener. In one process for a particular sound having a left and right channel to at least be partially played back in a left and right speaker, a sound event in the left channel is identified and time shifted, i.e. offset or phase shifted, from the same sound event occurring in the right channel. This may also be termed phase shifting. In another process, the gains for various frequencies or frequency ranges (or bands) of the sound event for the left and right channels are adjusted so that the gain for a given frequency band or bands is different across the channels. This may be termed gain shift. In a still further process, the left and right channels (or other channels if more than two channels are processed) are combined for possible further modification and playback. In other embodiments, audio content can be processed without identifying and operating on specific sound events. For example, particular frequency bands can be identified in the audio content independently from events, and the particular frequency bands can be phase shifted and gain shifted to enhance or otherwise manipulate the resultant sound produced by the audio content.

A sound event as used herein may include, but is not limited to, a sound of interest to a listener. For example, an explosion may be a sound event. As another example, human speech may be a sound event, and an object of the process may be to enhance that speech so that it is more readily audible above background or other noises. It should be understood that a portion of or all of the sound event may be phase shifted as well as a portion or all of the sound event may be adjusted for frequency gain. Additionally, different portions of a sound event may be phase or time shifted differently from other portions of the same sound event.

Systems and methods for performing the audio content modification may be implemented in a variety of different ways. For example, in one embodiment, the device is a headset having on the headset one or more controls that adjust the phase shift at one or more frequencies of the sound wave and one or more controls that adjust the frequency gain of one or more frequencies of the sound wave. The controls may be located in various places on the headset. The controls may be analog controls to control the audio signal to be sent to the headset speakers. In another embodiment, the controls may be operative to control one or more DSPs or other processors that are used to modify digital audio content.

In another example, the device is an audio playback machine having one or more controls that adjust the phase shift at one or more frequencies of the sound wave and one or more controls that adjust the frequency shift of one or more frequencies of the sound wave. The controls may be located on the audio playback machine as physical "knobs" or soft-keys, such as may be found on a smart phone. The controls may be analog controls to control the audio signal to be sent to the headset speakers. In another embodiment, the controls may be operative to control one or more DSPs or other processors that are used to modify digital audio content. The audio playback device can be an electronic media player such as an mp3 player, smartphone, computer, or other like audio playback device.

In yet another embodiment, systems and methods may be implemented on a processing system to process audio recordings to achieve the desired effects. For example, software running on a computing device, or a combination of software and hardware devices, can be used to analyze an audio file, identify sound events, determine what actions may be appropriate to enhance (or suppress) a sound event, and apply phase shift, gain shift or other processing to appropriately adjust an identified sound event. In other embodiments, software running on a computing device, or a combination of software and hardware devices, can be used to analyze an audio file, identify one or more frequency band(s) of interest and apply the appropriate phase and gain shifts as appropriate, and if desired, operate on a combined audio channel to further modify the audio content.

In further embodiments, systems and methods may be implemented on a device to enhance the audio qualities of speech. For example, systems and methods can be implemented with dedicated and multi-mode electronic devices including cell phones (including smart phones), two-way radios, tablet computers, PCs, speech-recording devices, and other devices for recording, capturing, playback or communicating speech. In various embodiments, frequencies associated with human speech are notched out to improve their signal level relative to other frequencies using a gate or bandpass filter. Additionally, where known sources of noise reside at particular frequency levels, those sources can be filtered out. In other words, specific stop band filters can be applied to notch out noise occurring at known frequencies.

Where the emphasis is on the human voice, gating or equalization can be used to enhance the middle frequencies where the voice typically resides. Bandpass filters can be used to pass signals in a frequency band associated with human vocal range (or other determined range) and to block or reduce the signal level of signals outside that range. For example, signal levels outside the desired range can be filtered so as to be reduced by 3 dB or more, although other cutoffs can be defined. Additionally or alternatively, the frequency range in which voice is anticipated can be amplified. For example, in some embodiments, gating or equalization can be used to enhance the frequency band from approximately 300 Hz to 3400 Hz. In other embodiments, other frequency bands can be enhanced depending on the anticipated audio content. In further embodiments, a narrower frequency band can be chosen to enhance most or at least part of the speech content while suppressing noise that may fall within the outer ranges of the frequency band associated with human vocal range.

Additionally, compression can be applied to amplify the lower amplitude signals and suppress the higher amplitude frequencies. In other embodiments, such as applications where the speech is captured by a person talking on a cellular telephone or other like device, the process can be implemented to amplify the frequency band in which the highest energy sounds are occurring relative to the other frequency bands. Likewise, the other frequency bands can be suppressed.

In various embodiments, the process can be implemented to adjust the signal level from the device microphone depending on the environment. For example, where the user is positioned in close proximity to microphone, the signal level from the microphone can be reduced while still maintaining an acceptable level of the speech signal. A benefit of this is that the background noise level will also be reduced. On the other hand, where the user is positioned farther from the microphone, such as in speakerphone mode, signal level from the microphone can be increased to better capture the speaker's voice. Because this will also tend to increase the level of background noise, it may also be desirable to include bandpass filtering or gating to further enhance the speech relative to the noise.

In further embodiments, the process can be implemented to detect device operational parameters and apply speech processing tailored to those parameters. For example, the process can be configured to determine whether the device is in regular mode, speakerphone mode, headset mode, or other mode and adjust the processing accordingly. Likewise, the process can be implemented to determine whether the device is in a speech mode (e.g., operating as a phone or a voice recorder), or in a music mode (e.g., operating as a streaming media player or an MP3 player). Accordingly, the process can be configured to adjust its processing based on whether the device is in speech mode or music mode and apply the appropriate processing to the audio content.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

Figure 1:
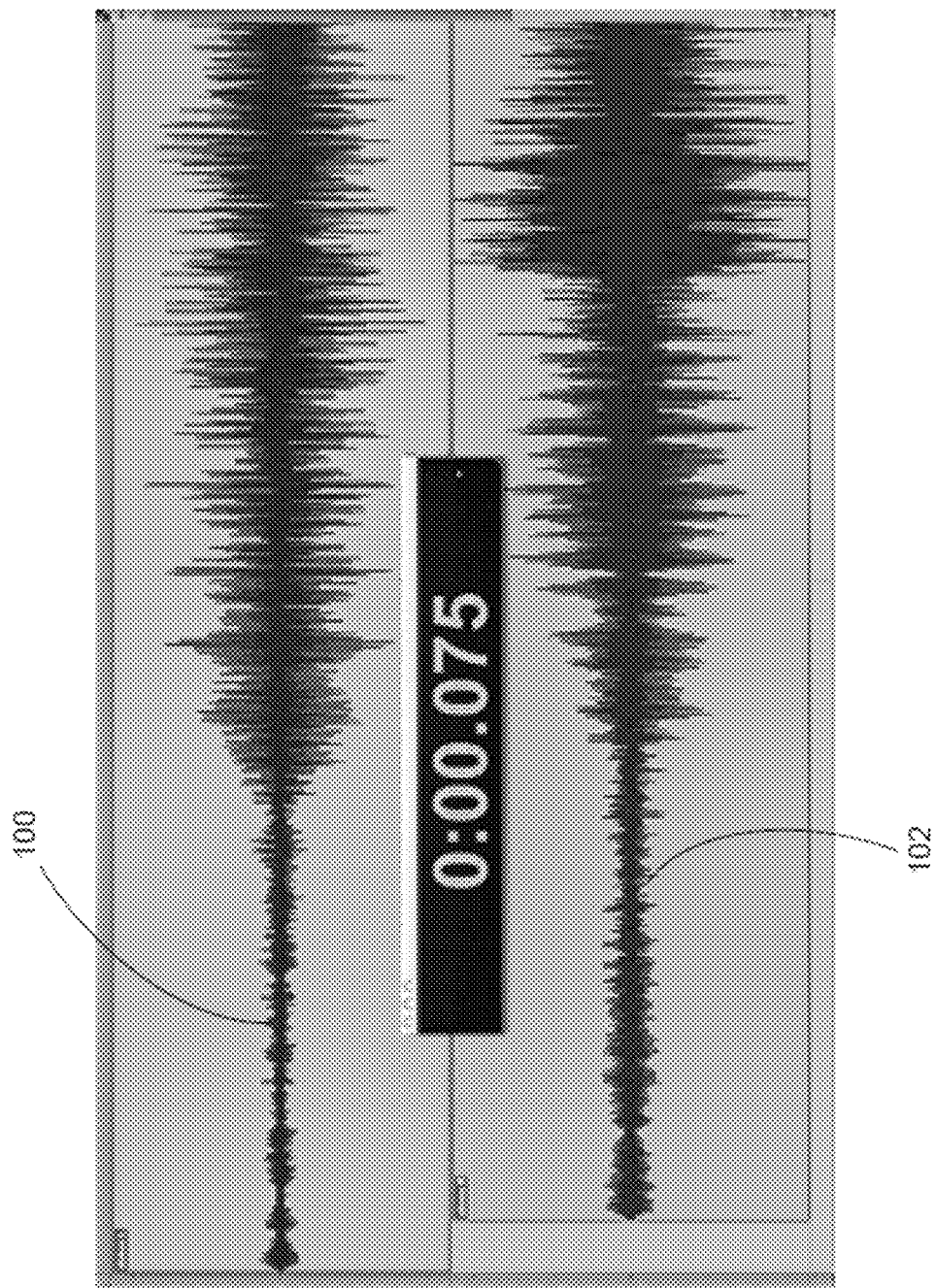
FIG. 1 is a diagram illustrating a left channel that has been phase shifted relative to a right channel in a two-channel system.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

The present invention is directed toward a system and method for providing enhancement of audio content. In various embodiments, systems and methods described herein receive audio content in multiple channels and operate on the audio content in each channel to differentiate characteristics of the audio content on each channel relative to the other channel. For example, in some embodiments the systems and methods described herein operate differently on different frequency components of the audio content on a given channel. Two or three or more frequency bands can be identified on a given channel and the phase and gain of the content in a given frequency band altered for one channel relative to the other channel(s). That is the phase of a given frequency band can be delayed in one channel and not delayed in the other channel(s), or delayed to a greater or lesser extent in the other channel(s). Likewise the gain of a given frequency band can be increased in one channel and held constant in the other channel(s), or increased to a greater or lesser extent in the other channel(s).

With conventional systems, especially two channel systems (i.e., having a left and right channel), sound is modified by phase shifting the sound in one channel as compared to the other to make the sound appear as if it is emanating from somewhere other than the speakers. If done properly, this may work for lower frequencies, but the inventor has discovered that this technique is inadequate for the higher frequencies. Further, the amount of phase shifting that may be applied is limited by the characteristics of the sound wave itself. Thus, it is possible that the sound wave limits the amount of shifting that may be applied before the brain hears two different sounds rather than a single sound. Thus, while increasing the amount of shifting may increase the immersive or three-dimensional sound coming from a set of speakers, the current art is limited because of the focus on the phase shift.

The presently disclosed subject matter provides an ability to increase the effect of a phase shift while also providing for the effect on higher frequency portions of the audio content. The presently disclosed subject matter uses a combination of phase shifting and gain adjustment of various high frequency portions of the audio content. In some embodiments, the systems and methods described herein can be implemented to both increase the effect of phase shifting of a sound wave as well as to increase the three dimensional aspect of higher frequencies of a sound wave.

Because it is believed that the brain processes higher frequencies different from lower frequencies, conventional techniques for using phase shifting only provide for an immersive or three-dimensional effect at the lower frequencies and neglect the higher frequencies. For example, merely increasing the gain of the entire sound wave, as opposed to phase shifting and preferential gain adjustment for each channel, would only cause a louder signal and would not provide an immersive or three-dimensional effect. Additionally, conventional methods are limited as to the compression ratios that may be used. For example, some embodiments of the systems and methods described herein may be used for low-bit-rate compression ratios of 320 kbps down to 64 kbps, which is the typical range of compression ratios for an MP3 file.

FIG. 1 is a diagram illustrating a left channel that has been phase shifted relative to a right channel in a two-channel system. As discussed above, the systems and methods described herein are not limited to a two-channel system but may be applied to various other systems having two or more channels. As shown in the example of FIG. 1, there are two channels of a sound wave, a left channel 100 and a right channel 102. Although there are various sound events that are not duplicated in the channel, right channel 102 is phase (or time) shifted 0.075 milliseconds so that the sound events that occur in right channel 102 occur 0.075 milliseconds after the same sound events occurred in left channel 100.

The amount of phase shifting actually applied by the systems and methods described herein may vary from application to application. Additionally, because the amount of phase shift that may be applied to a sound event depends on the characteristics of the sound, the amount of phase shifting applied may vary.

For example, characteristics of a sound event can be used in some embodiments to determine the amount of phase shifting applied. These can include characteristics such as, for example, the fullness of a sound event, the length of a sound event, and the sustain qualities in a sound event. For example, a sustained sound event can usually be given more spread or phase shift while sound events with a fast attack typically cannot be phase shifted as much without adversely affecting sound quality. An example of sustained sound events that typically benefit from a greater amount of phase shifting are bass notes in a bass line, or beats from a kick drum. An example of fast attack sound events is hits on a high hat symbol. Accordingly, in one embodiment, the amount of phase shift added can depend on the frequency. Sound events in the bass line or from the kick drum, which can be phase shifted to a higher degree, are in the low frequency range (e.g., a kick drum beat is typically around 49 Hz). Therefore, the spectrum analyzer can be configured to detect these low-frequency sound events and the processor can be configured to phase shift these events to a greater extent. On the other hand, fast attack sound events tend to be in the higher frequencies. Accordingly, where the spectrum analyzer detects high frequency sound events the processor can be programmed to apply little or no phase shift to these events.

In some embodiments, the system can be programmed to apply a fixed amount of phase shift to each of the defined frequency bands where, in some embodiments, the fixed amount of phase shift is largest for the low frequency band and is decreased in amount for each successively higher frequency band. In other embodiments, the system can be configured to detect sound events and determine whether they are sustained or fast-attack sound events (e.g., to determine frequency, and duration of event) and to apply phase shifting to the events accordingly.

In various embodiments, the system can be configured to allow for a range of permitted phase shifting that can be applied. As a further example, this range can be anywhere between 0.001 to 0.390 milliseconds, although other ranges can be used. A more conservative range that can be implemented in some embodiments is between 0.001 and 0.110 milliseconds. A less conservative range could be broader. In some embodiments, the operator can be allowed to tailor the range according to taste, desired goals and audio content. Considering the conservative range with the above example of sound events from the bass line or kick drum, where the spectrum analyzer detects these low-frequency events, the processor can be programmed to apply an amount of phase shifting at the higher end of this range—say 0.070 to 0.110 milliseconds. Where the spectrum analyzer detects fast attack events, it can be programmed to apply no phase shifting or only minimal phase shifting—e.g., 0.001-0.010 milliseconds. In some embodiments, where user input is provided to the process, the user can be given the control to override the automatic decision on a case-by-case basis and add more or less phase shifting to sound events.

The way in which the audio content was originally recorded may affect a sound event and may impact the amount of phase shifting that can be added to the content as a whole or that may be added to individual sound events. For example, where the audio content already includes a large degree of separation, it may not be desirable to add phase shifting to the content. Adding too much phase shift can cause an audio recording to become off tempo or sound disjointed.

Figure 2:
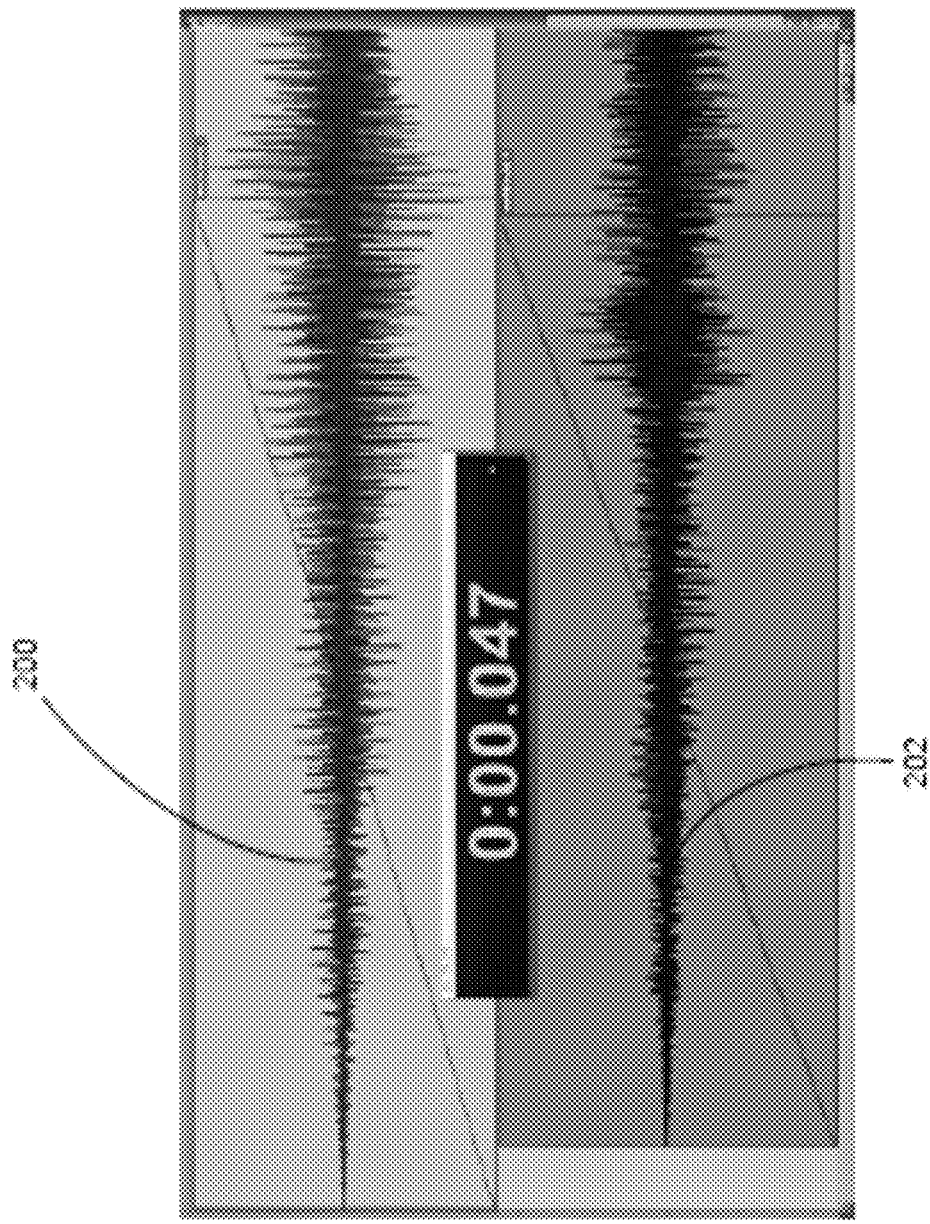
FIG. 2 shows a sound wave having two channels that are phase shifted to a lesser degree than that shown in FIG. 1.
Figure 3:
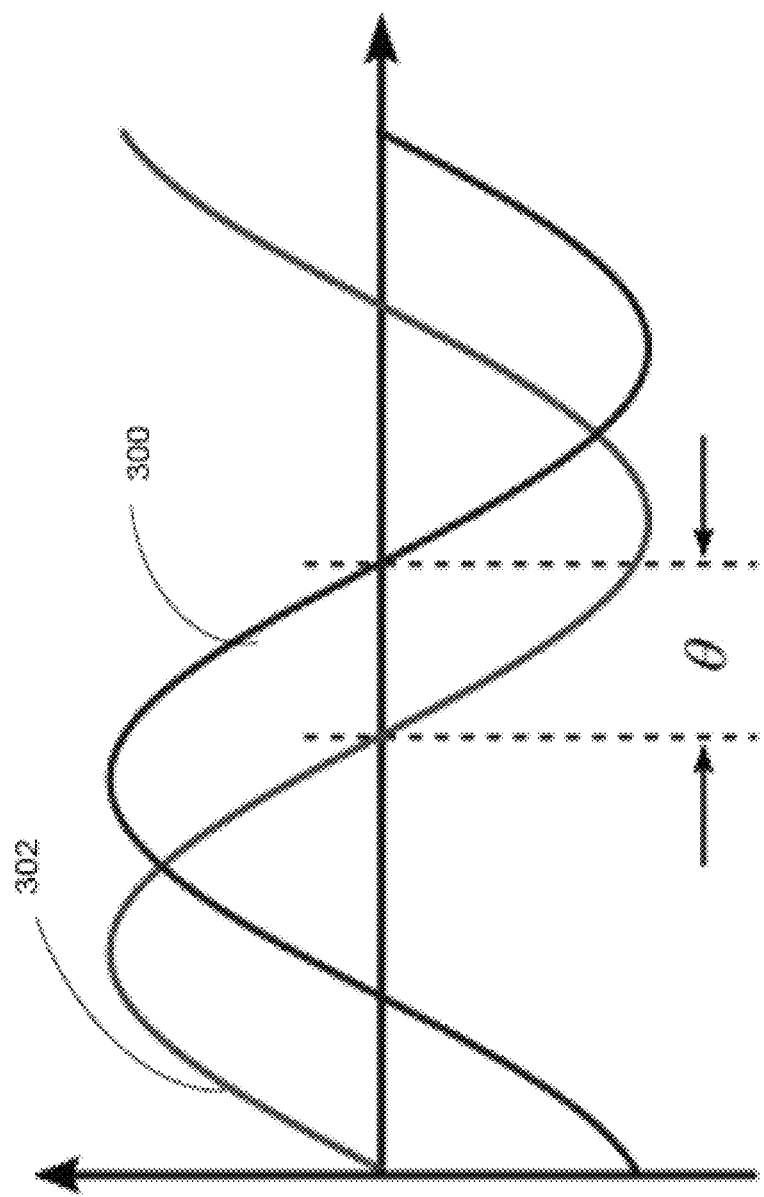
FIG. 3 is a diagram illustrating a phase shift with a simple sinusoid.

For example, FIG. 2 shows a sound wave having two channels, left channel 200 and right channel 202, that are phase shifted to a lesser degree than that shown in FIG. 1. In FIG. 2, right channel 202 is phase shifted 0.047 milliseconds behind left channel 200. As discussed above, this is done to alter the perceived location of the sound. Thus, in some instances, the sound emanating from a headset or speakers will not be perceived as to be coming from the headset, but rather, a one or more locations surrounding the listener, thus creating the three dimensional effect. Further, as also discussed above, the amount of phase shifting that can be applied to two or more channels may be limited by the sound itself. That is, too much phase shifting may create a garbled sound, may create an echo effect, or may create other undesirable effects. FIG. 3 is a diagram illustrating a phase shift with a simple sinusoid. Left channel waveform 300 is shifted ahead of right channel waveform 302 by time difference Θ.

Thus, in an attempt to both increase the effect of a phase shift as well as provide for a three dimensional effect of higher frequency portions of a sound, the presently disclosed subject matter also provides for the adjustment of gain for higher frequencies. Although what may be defined as a higher frequency may vary among those of ordinary skill in the art, as applied to the presently disclosed subject matter, the higher frequency may be deemed to be frequencies from various bands of frequencies of the audible hearing range, but are preferably frequencies above 1.5 kHz to approximately 18 kHz. In other embodiments, high frequencies may be as low as 800 Hz and as high as 22 kHz.

Figure 4:
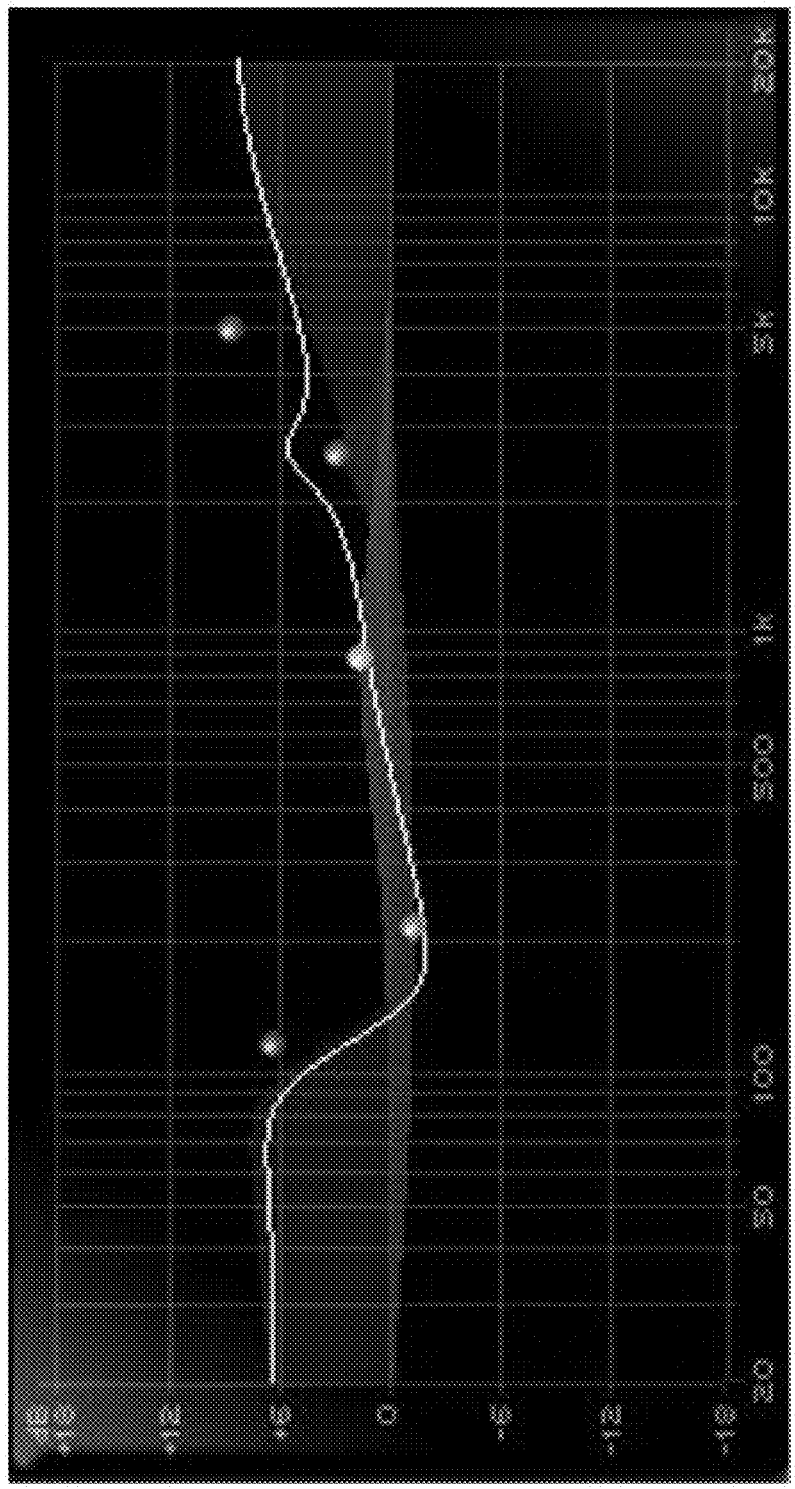
FIG. 4 is a graph showing the adjustment of frequencies in an exemplary left channel of a sound wave.

FIG. 4 is a graph showing an example of the adjustment of frequencies in a left channel of a sound wave in accordance with one embodiment of the systems and methods described herein. It should be understood that the frequencies specified in this or other figures in which the gain is adjusted are exemplary frequencies. It is within the scope of this presently disclosed subject matter that the gain may be adjusted for any number of frequencies. Further, the gain adjusted for each frequency is by way of example and should not be viewed as a limitation. As shown, at 116 Hz, a low frequency, a gain of 6.5 dB is applied. At 215 Hz, another low frequency, the gain of minus 1.2 dB is applied. At a midrange frequency, 877 Hz, a gain of 1.6 dB is applied. At a higher midrange frequency, 2.55 kHz, a gain of 2.9 dB is applied. Further, at a high frequency, in this case 4.91 kHz, a gain of 8.8 dB is applied. Thus, at the higher frequencies, the gain applied is increased an in attempt to provide for the three dimensional feel of the higher frequency portions of a sound wave as well as to stimulate the brain into increasing the effect of the phase shifting at the lower frequencies.

Figure 5:
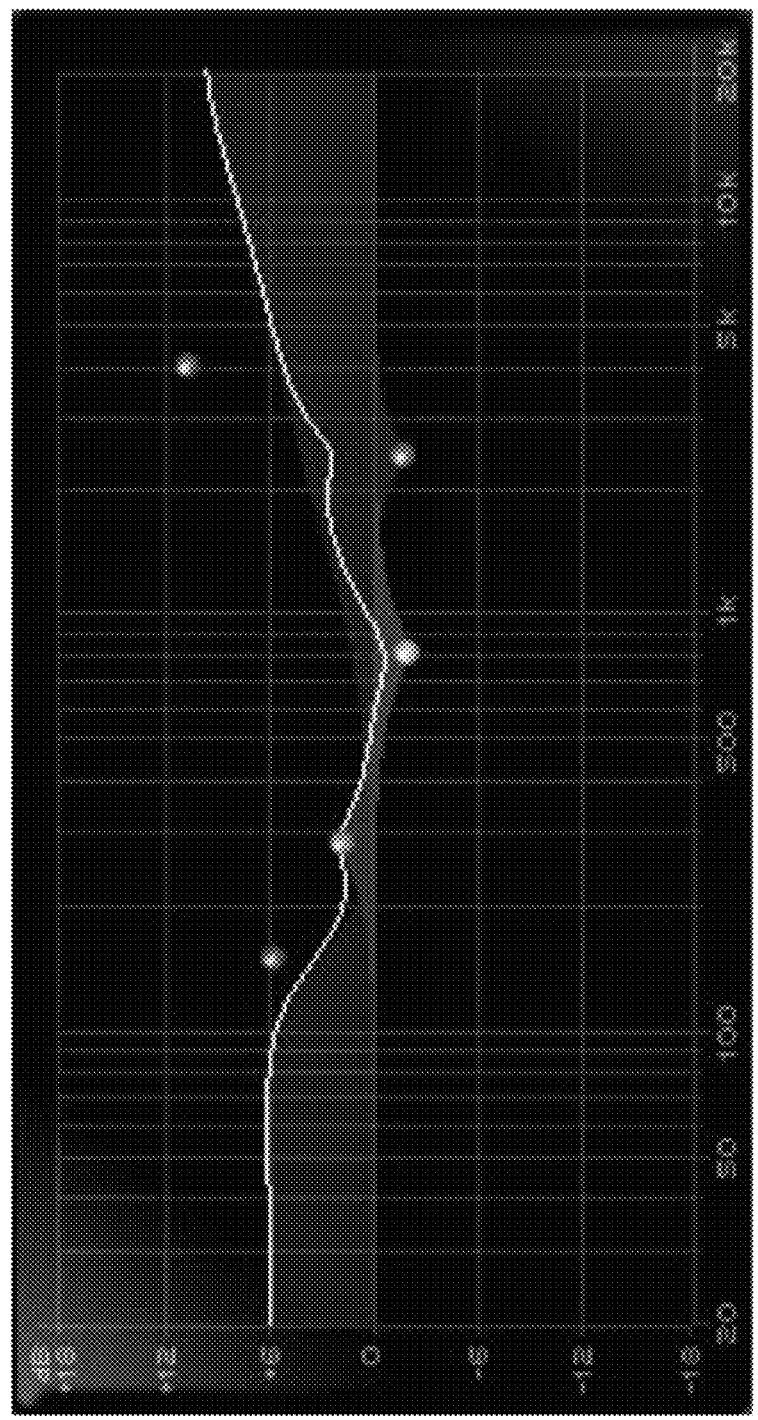
FIG. 5 is a graph showing the adjustment of frequencies in an exemplary right channel of a sound wave which, by way of example, may or may not be used in conjunction with the sound wave shown in FIG. 4.

FIG. 5 is a graph showing the adjustment of frequencies in an exemplary right channel of a sound wave which, by way of example, may or may not be used in conjunction with the sound wave shown in FIG. 4. It should be understood that the frequencies specified in this or other figures in which the gain is adjusted are exemplary frequencies. It is within the scope of this presently disclosed subject matter that the gain may be adjusted for any number of frequencies. Further, the gain adjusted for each frequency is by way of example and should not be viewed as a limitation. As shown, at 150 Hz, a low frequency, a gain of 5.9 dB is applied. At 284 Hz, another low frequency, a gain of 1.8 dB is applied. At a midrange frequency, 810.3 Hz, a gain of minus 1.8 dB is applied. At a higher midrange frequency, 2.41 kHz, a gain of 1.6 dB is applied. Further, at a high frequency, in this example, 3.95 kHz, a gain of 10.8 dB is applied. Thus, at the higher frequencies, the gain applied is increased an in attempt to provide for the three dimensional feel of the higher frequency portions of a sound wave as well as to stimulate the brain into increasing the effect of the phase shifting at the lower frequencies.

In various embodiments of the systems and methods described herein, the frequency gains of the multiple channels may be adjusted using different set points and different frequencies for each channel. That is, where a phase shift or gain, or both, are applied in one channel to a given frequency or frequency band, the same shifts may be, but are not necessarily, applied to that same frequency or frequency band in another channel. Likewise, the shifts may be applied at different levels from one channel to the next. The reason for this is that if a given frequency or frequency band is adjusted the same on both the left and right channels, this would typically not add a spatial effect to that frequency or frequency band. Depending on the component being addressed, this could even decrease the quality of the sound. Also, with phase shifting that puts the lower frequencies at a different perceived location, if the higher frequencies are not compensated for, the phase shifting may cause the brain to be "confused" as to the location of the sound, thus creating poor sound effects.

Figure 6:
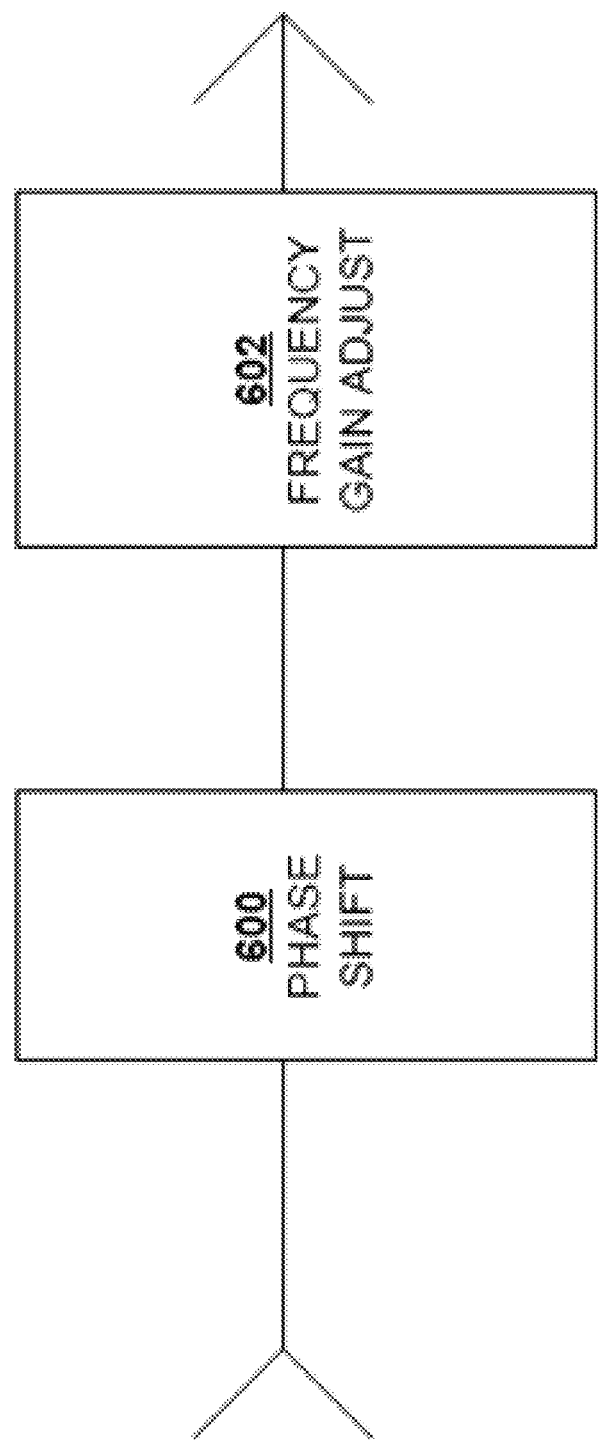
FIG. 6 illustrates an example of a system and method for modifying a sound signal in accordance with one embodiment of the systems and methods described herein.

The systems and methods described herein may be implemented using various different techniques or means for phase shifting and frequency gain adjustment. FIG. 6 illustrates an example of a system and method for modifying a sound signal in accordance with one embodiment of the systems and methods described herein. Referring now to FIG. 6, the phase of a sound wave is shifted at operation 600. In a two-channel system (e.g., a system having a left and right channel), the phase shifting is applied to one or more sound components of one channel to result in a phase difference for that sound component between the left and right channels. In a system having more than two channels, the phase shifting may be applied between two or more channels on the same side, two or more channels on opposite sides, or to otherwise phase shift the audio component in one or more channels relative to one or more of the other channels. Accordingly, operation 600 is not limited to phase shifting between two channels on the opposite sides (i.e. a left and right channel). At operation 602, the frequency gains are adjusted. Preferably, the gains of one or more of the high frequencies of a sound component are also adjusted on one channel relative to the other channel.

It should be noted that operations 600 and 602 may be performed in various orders or in multiple steps. For example, the higher frequencies of a left and right channel may have their gains adjusted prior to phase shifting. Further, where a system has more than two channels, phase shifts and gains may be applied to one or more channels to adjust the frequency components on those one or more channels relative to one or more other channels in the system. For example, if the system includes four channels, one upper left and lower left, and one upper right and lower right, the frequencies and phase shifting of the various channels may be adjusted in various orders to create the desired effect. Additionally, steps 600 and 602 may be performed using hardware components or software.

For example, for hardware embodiments operating on an audio signal, bandpass filters can be used in a channel to separate the audio signal into multiple frequency components. As a further example, a low-pass filter can used separate out the low frequencies, a high-pass filter can be used to separate out the high frequencies, and a bandpass filter having a passband in the middle frequencies can be used to separate out the mid-level frequencies. Additional bandpass filters can be used to separate the channel into finer frequency bands. Once separated, gain blocks or amplifiers can be provided for each frequency to adjust the gain of a given frequency band. Also, delay lines or phasers can be provided for each frequency to adjust the phase or delay of a given frequency band. The separated frequency components on each channel can be recombined into a composite channel signal to create a modified signal for that channel.

For software embodiments, tools or modules can be provided to perform the same or similar functions using software components running on a processor such as a general-purpose processor or a digital signal processor. For example, software bandpass filter modules can be used to isolate and operate on desired frequency bands. Examples of commercially available software that can be used to adjust phase and gain of individual frequency components are Wavelab7® available from Steinberg Media Technologies GmbH, and Avid® Pro Tools®, available from Avid Technology, Inc.

Additional aspects are contemplated and are considered to be within the scope of the present invention. For example, an additional embodiment may include the coordination of the objects in a video having three dimensions along with the sounds of one of more of those objects. For example, a three dimensional spatial grid may be devised in which various positions in the grid are associated with various phase shifting and frequency gain adjustments. The video may be overlaid on that grid and objects within the object may be assigned various coordinates based upon their determined position within the grid. The positions are input into a system that applies the particular phase shifting and frequency shifting modifications to cause perception that audibly the object is in a certain position corresponding to that objects position in the video.

Figure 7:
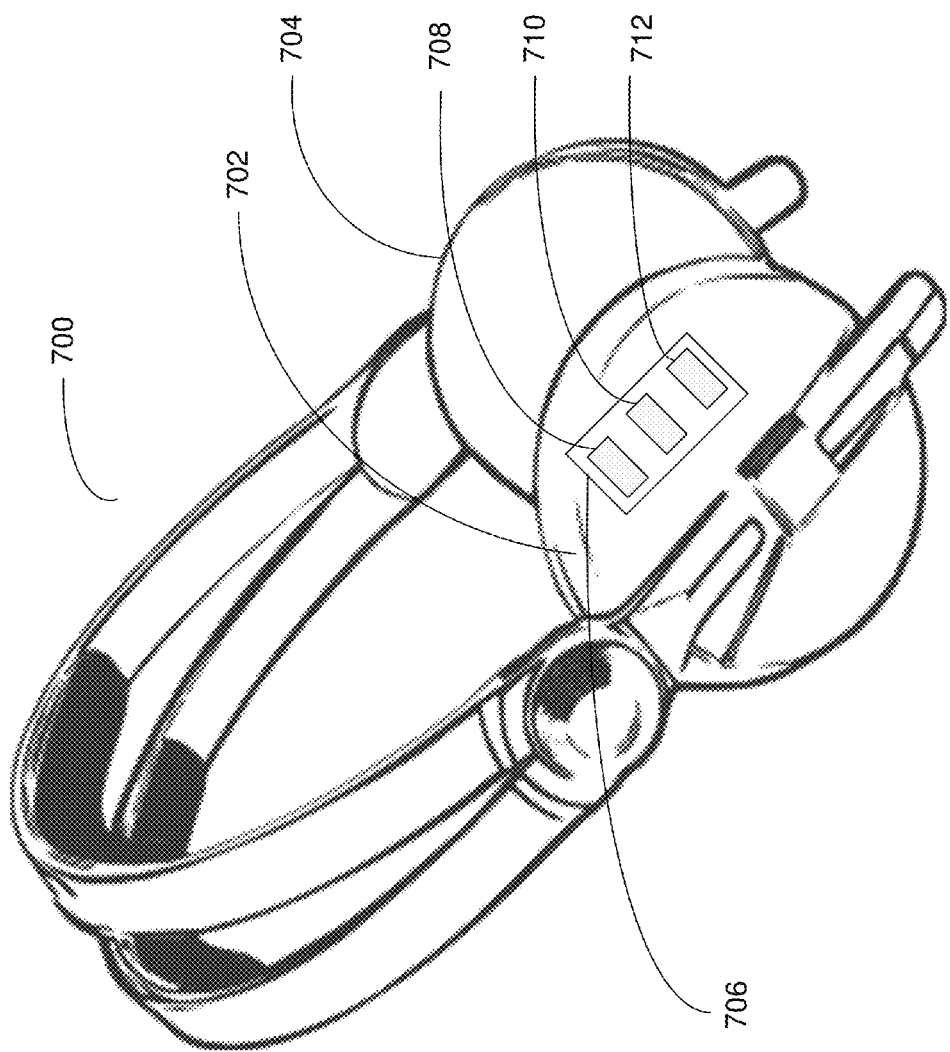
FIG. 7 illustrates an exemplary device that may be used in accordance with one embodiment of the systems and methods described herein.

FIG. 7 illustrates an exemplary device that may be used in accordance with one embodiment of the systems and methods described herein. Shown in this example is a pair of headphones 700 having left earpiece 702 and right earpiece 704. A sound file received by headphones 700 typically includes a left and right channel—i.e., one channel for each earpiece. In the illustrated configuration, modification panel 706 provides a user interface to adjust the phase and gain of audio content on the left and right audio channels received at headphone 700. Modification panel 706 may comprise various controls, including, but not limited to: volume adjust 708; phase shift adjust 710; and frequency gain adjust 712. The controls could be knobs, dials, switches or other like control to adjust the gain, phase or frequency of the audio components. To manually modify the sound wave entering into headphone 700 to be played using speakers (not shown) in left earpiece 702 and right earpiece 704, the user (not shown) adjusts controls 708, 710 and 712.

To adjust the phase shift of the sound wave, the user may add in and adjust (i.e., increase or decrease) a desired amount of phase difference between the left and right channels by using phase shift adjust 710. Phase shift adjust 710 may be configured to control the phase shift of the sound wave between the left and right channels at specific frequencies, such as lower frequencies of the sound wave, or may be configured to control the phase shift between the entire left and right channels. Additionally, phase shift adjust 710 may be configured to have preloaded default or recommended settings, such as, for example, a default frequency band for phase adjustment. In other embodiments, an additional switch can be added to select the frequency or frequency band that is adjusted by phase shift adjust 710. In further embodiments, a phase shift adjust 710 mechanism can be provided to adjust the phase difference of desired frequencies on both the left and right channels.

To adjust the frequency shift of the sound wave, the user may increase or decrease the frequency gain between the left and right channels by using frequency gain adjust 712. Frequency gain adjust 712 may be configured to control the gain of the sound wave of the left and right channels at specific frequencies, such as higher frequencies of the sound wave, or may be configured to control the gain between the entire left and right channels. Additionally, frequency gain adjust 712 may be configured to have preloaded default or recommended settings. In other embodiments, an additional switch can be added to select the frequency or frequency band that is adjusted by frequency gain adjust 712. In further embodiments, a frequency gain adjust 712 mechanism can be provided to adjust the gain of desired frequencies on both the left and right channels.

Figure 8:
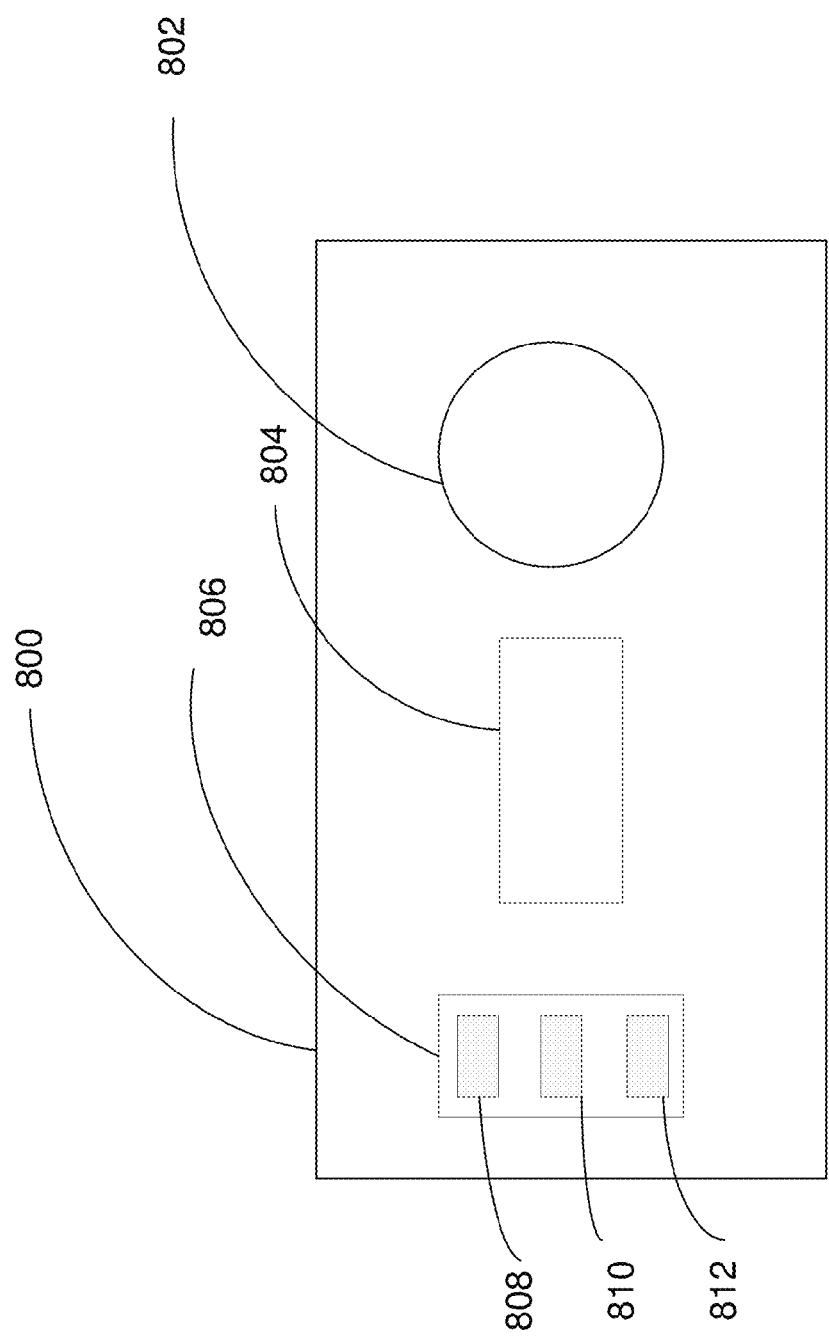
FIG. 8 is a diagram illustrating an example of an equalizer or amplifier that may be used to modify the sound wave according various embodiments of the systems and methods described herein.

FIG. 8 is a diagram illustrating an example of an equalizer or amplifier that may be used to modify the sound wave according various embodiments of the systems and methods described herein. Equalizer 800 in this example includes controls 802 for adjusting the volume of the sound coming from speakers (not shown). Equalizer 800 has also display 804 configured to display various aspects of the usage of equalizer 800. Additionally, equalizer 800 has control panel 806 to modify the sound according various embodiments described herein. Control panel 806 may have controls for, but not limited to: frequency gain adjust 808; phase shift adjust 810; and 3D immersion adjust 812.

To adjust the frequency gain of the sound wave, the user may increase or decrease the frequency gain between the left and right channels by using frequency gain shift adjust 808. Frequency gain adjust 808 may be configured to control the gain of the sound wave of the left and right channels at specific frequencies, such as higher frequencies of the sound wave, or may be configured to control the gain between the entire left and right channels. Additionally, frequency shift adjust 808 may be configured to have preloaded default or recommended settings. In other embodiments, an additional switch can be added to select the frequency or frequency band that is adjusted by frequency gain adjust 808. In further embodiments, a frequency gain adjust 808 mechanism can be provided to adjust the gain of desired frequencies on both the left and right channels.

To adjust the phase shift of the sound wave, the user may add in and adjust (e.g., increase or decrease) the phase difference between the left and right channels by using phase shift adjust 810. Phase shift adjust 810 may be configured to control the phase shift of the sound wave between the left and right channels at specific frequencies, such as lower frequencies of the sound wave, or may be configured to control the phase shift between the entire left and right channels. Additionally, phase shift adjust 810 may be configured to have preloaded default or recommended settings. In other embodiments, an additional switch can be added to select the frequency or frequency band that is adjusted by phase shift adjust 810. In further embodiments, a phase shift adjust 810 mechanism can be provided to adjust the gain of desired frequencies on both the left and right channels.

It may be desirable that the user be provided with the ability to adjust both the phase shift and frequency gain shift at the same time. Thus, control panel 806 may also have 3D immersion control 812 that is configured to provide the ability to control both the phase shift and the frequency shift simultaneously. When using this control, the amount of phase shift and/or frequency shift may be default amounts established by a manufacturer of equalizer 800 or may be adjustable by a user of equalizer 800.

Figure 9:
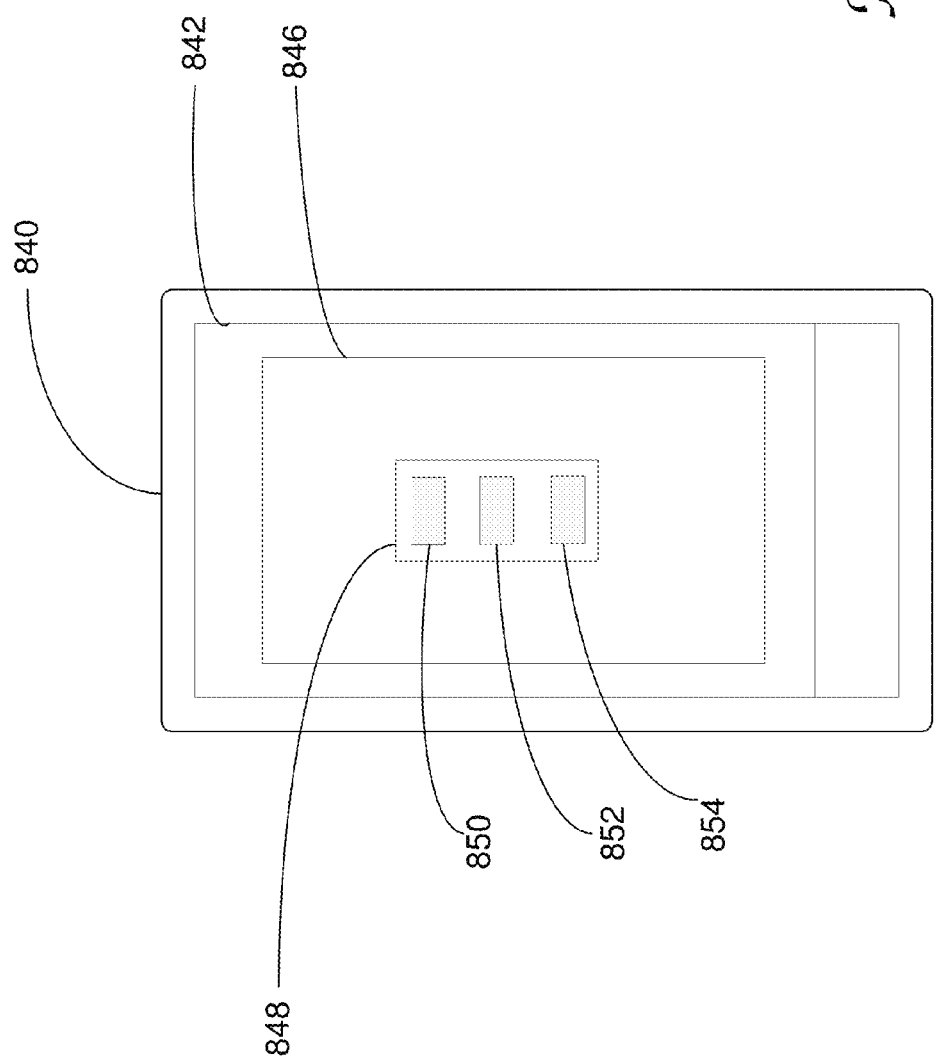
FIG. 9 is a diagram illustrating a device running an application for modifying a sound wave according to various embodiments of the systems and methods described herein.

FIG. 9 is a diagram illustrating a device running an application for modifying a sound wave according to various embodiments of the systems and methods described herein. Smart phone 840 has display 842 that displays various applications that a user may be using on smart phone 840. It should be noted that although the current description is related to a smart phone, the presently disclosed subject matter is not limited to a smart phone, as the scope also encompasses other devices capable of running an application, such as a personal computer, MP3 player, tablet, etc.

Referring now to FIG. 9, a user is running 3D immersion application 846 which includes a user interface preferably displayed on display 842, although it should be noted that the presently disclosed subject matter is not limited to an application that needs to be or is displayed. In various embodiments, application 846 receives music from an internal or external source, modifies the music according the presently disclosed subject matter, and then outputs a modified file for playback to the listener or for storage, or both.

To modify the music, application 846 receives a music file, which is thereafter modified using control panel 848. Control panel 848 may have controls for, but not limited to: frequency gain shift adjust 850; phase shift adjust 852; and 3D immersion adjust 854. To adjust the frequency gain shift of the sound wave, the user may increase or decrease the gain of a frequency or frequency band on one channel relative to the other channel using frequency gain shift adjust 850. Frequency gain shift adjust 850 may be configured to control the gain of the sound wave of the left and right channels (or additional channels if provided) at specific frequencies, such as higher frequencies of the sound wave, or may be configured to control the gain between the entire left and right channels. Additionally, frequency shift adjust 850 may be configured to have preloaded default or recommended settings. In other embodiments, an additional button can be added to select the frequency or frequency band that is adjusted by frequency gain adjust 712. In further embodiments, a frequency gain adjust 712 mechanism can be provided to adjust the gain of desired frequencies on both the left and right channels.

To adjust the phase shift of the sound wave, the user may increase or decrease the phase between the left and right channels by using phase shift adjust 852. Phase shift adjust 852 may be configured to control the phase shift of the sound wave of the left and right channels at specific frequencies, such as lower frequencies of the sound wave, or may be configured to control the phase shift between the entire left and right channels. Additionally, phase shift adjust 852 may be configured to have preloaded default or recommended settings. In other embodiments, an additional switch can be added to select the frequency or frequency band that is adjusted by phase shift adjust 852. In further embodiments, a phase shift adjust 852 mechanism can be provided to adjust the gain of desired frequencies on both the left and right channels.

It may be desirable that the user be provided with the ability to adjust both the phase shift and frequency gain shift at the same time. Thus, control panel 848 may also have 3D immersion control 854 that is configured to provide for the ability to control both the phase shift and the frequency shift simultaneously. When using this control, the amount of phase shift and/or frequency shift may be default amounts established by a manufacturer or may be adjustable by a user.

With the various example embodiments described herein, the user interface can be provided as a GUI on a screen or as physical knobs or switches (or other like controls) to control the amount of phase shift, frequency gain shift or other immersion effect applied to one or more frequencies or frequency bands. With a GUI, soft controls can be provided to allow multiple different functions to be controlled using a single controller (e.g., slider or knob). Whether implemented using a GUI or otherwise, frequency setting controls can be included to select the frequency or frequency band for which an effect is being applied. Alternatively, multiple different controls can be provided to control different frequencies or frequency bands.

These controls can be provided to apply the desired effects in either the analog or the digital domains. For example, in the analog domain, bandpass filters can be used to separate the signal on a channel into different frequency bands, and adjustable gain or delay stages (or both) added to one or more of the separated signal paths to allow adjustment of the phase or gain of that frequency component in that channel.

Figure 10:
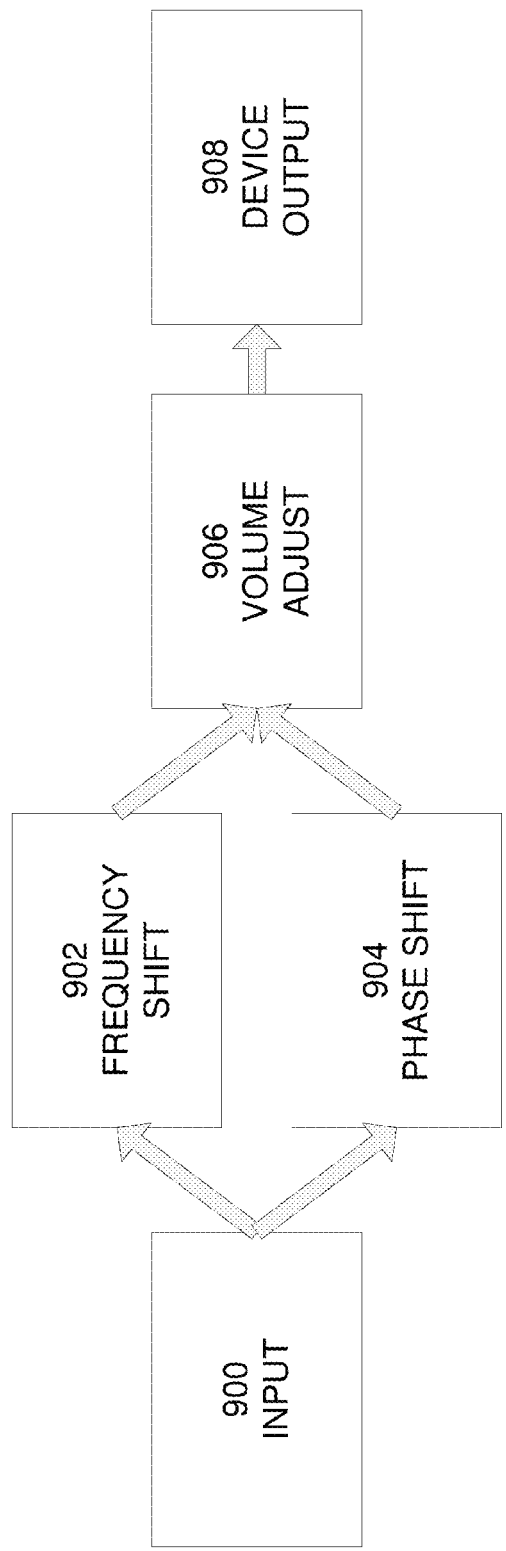
FIG. 10 is a functional block diagram of an example process for modifying a sound wave in accordance with one embodiment of the systems and methods described herein.

FIG. 10 is a functional block diagram of an example process for modifying a sound wave in accordance with one embodiment of the systems and methods described herein. It should be noted that the order of the operations in the illustrated process in this and other process diagrams is merely for explanatory purposes and should not be interpreted as a limitation of the scope of the application. A sound wave is received at input 900 and acted upon by either frequency gain shift 902 or phase shift 904, or both. For example, the sound wave's phase shift may be adjusted using phase shift 904 while the frequency gain may be held constant by not adding any frequency gain shift 902. The volume of the sound may be adjusted using volume adjust 906, with the output going to device output 908 (which may be a pair of headphone speakers). It should be noted that the inclusion of volume adjust 906 is exemplary only, as the volume may be adjusted at various stages or outside the process of FIG. 10.

Figure 11:
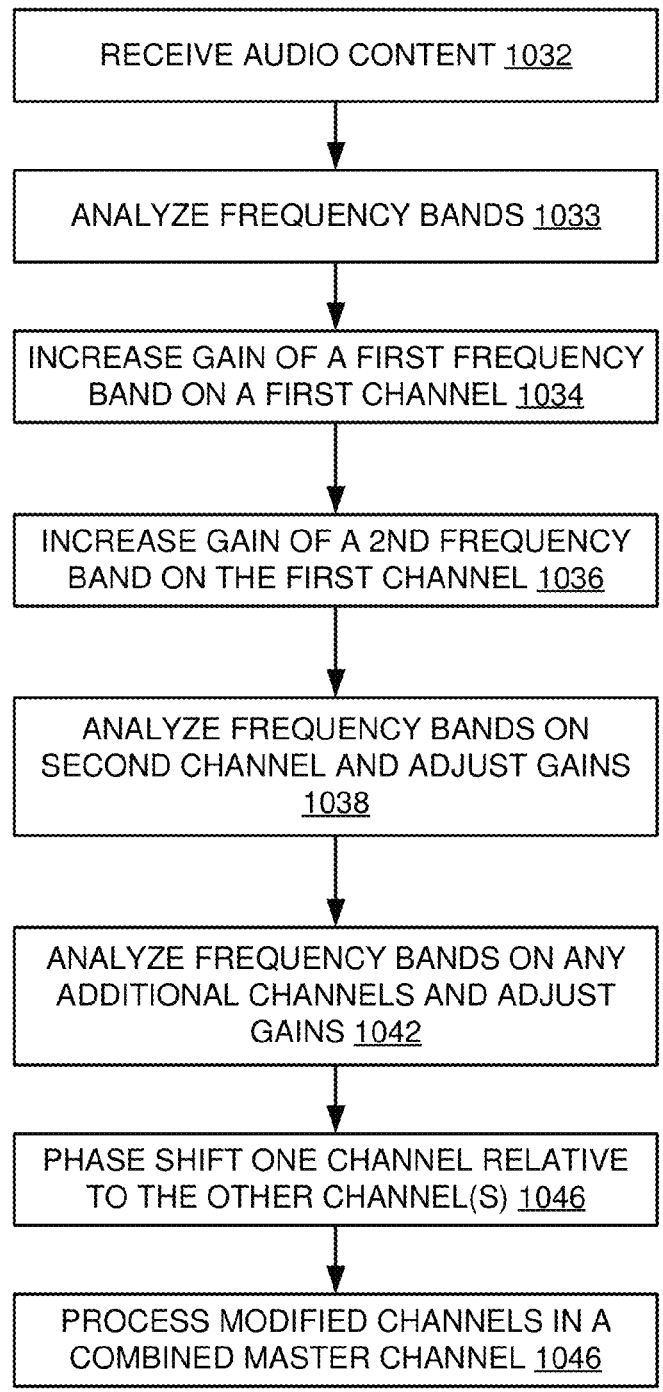
FIG. 11 is an operational flow diagram illustrating an example process for modifying audio content in accordance with one embodiment of the systems and methods described herein.

FIG. 11 is an operational flow diagram illustrating an example process for modifying audio content in accordance with one embodiment of the systems and methods described herein. Referring now to FIG. 11, in this example embodiment, a digital audio file is processed to match audio zones and perceived audio locations by creating two perceived audio zones, a first zone in the left/right directions and a second zone in the front/back directions. The process spatializes these audio zones to make them less "flat"—i.e., less linearly directional. This allows the sound to be perceived as moving in both zones, and the sound to be located in almost any area of those lobes. In operation, in various embodiments the process operates according to the methodology described with reference to FIG. 11.

Referring now to FIG. 11, at operation 1032, the system receives an audio signal having two or more channels of audio. For example, with two-channel audio, the two channels comprises a left channel and a right channel. Typically, the audio content on the left channel and the right channel includes content in a plurality of frequency bands. It is noted that although this description refers to operations on a 'left' channel and a 'right' channel, this is done merely for ease of description and the channels can be reversed for the process, or other channels can be used. In this description, the process is described as analyzing the left channel first. In other embodiments, the process can be configured to analyze the right channel first, or another different channel in systems with >2 channels.

At operation 1033, the system analyzes the frequency bands on a first of the multiple channels. A spectrum analyzer can be used to identify the signal levels of the audio content at various frequency bands. The frequency bands investigated can be predetermined in advance of the process. In another embodiment, the frequency range of the audio content can be swept, and frequencies grouped into frequency bands based on signal characteristics such as, for example signal levels. For example, the spectrum analyzer may, in some embodiments, be used to identify frequency bands that have signal levels below a predetermined threshold. For example, the identified frequency band(s) may have lower signal levels than other frequency bands in the track, or signal levels that are lower than the average signal level for the track. In various embodiments, the content is separated into five frequency bands for analysis relative to one another. In other embodiments, the signals can be divided into different numbers of frequency bands for analysis. This analysis can be done for each channel.

At operation 1034 the system increases the gain of one of the frequency bands identified in the analysis operation 1032. Assume for example, and by way of description only, that the analysis performed at operation 1032 analyzed five different frequency bands and identified two frequency bands that had lower than desired signal levels or lower than a threshold level. This can occur where, for example, two of the frequency bands had a signal level below a predefined signal level or below a predefined signal level range. As another example, the two frequency bands had a signal level below an average signal level of all frequency bands or below an average of all other frequency bands.

In the illustrated example, at operation 1034 the system analyzes the first of those two frequency bands and increases the gain of that frequency band. In some embodiments, the amount of gain added is an amount sufficient to increase the signal level of that frequency band by an amount sufficient to raise the signal level to the average signal level of the content (or the average signal level of the content without the subject frequency band or the average signal level of the content without the two below-threshold channels). In other embodiments, the amount of gain added is an amount sufficient to bring the signal level of that frequency component to within the range of signal levels of the other frequency components. For example, the signal level can be brought to a level at or near the level of the highest signal-level frequency component. In still other embodiments, the system can be configured to bring the signal level up to a predetermined desired signal level or up to within a predetermined desired range of signal levels.

Table 1 illustrates an example of an implementation in which the content is divided into five frequency bands for analysis and processing. Table 1 illustrates examples of frequency ranges and gain ranges for each frequency band in a five-band embodiment.

TABLE 1

Frequency Bands

| Frequency Band | Frequency Range | Signal Level Range |
| --- | --- | --- |
| Low Frequency | 21.0 Hz to 90.0 Hz | 0 dB to plus 8 dB |
| Low mid Frequency | 91.0 Hz to 313.0 Hz | 0 dB to plus 4 dB |
| Mid Frequency | 314.0 Hz to 1.03 kHz | 0 dB to plus 4 dB |
| High mid Frequency | 1.04 kHz to 3.87 kHz | 0 dB to plus 8 dB |
| High Frequency | 3.88 kHz to 20.00 kHz | 0 dB to plus 8 dB |

The example illustrated in Table 1 is slightly different from the examples illustrated in FIGS. 4 and 5. Particularly, in the examples illustrated in FIGS. 4 and 5, the cutoff points of the frequency ranges are slightly different. Also, in the example of FIG. 4, the low mid frequency is adjusted to an amount less than 0 dB, and in the example of FIG. 5, the mid and high mid frequencies are adjusted to an amount less than 0 dB. Accordingly, in another embodiment, signal level ranges can be defined as −3 dB to plus 3 dB. As another example, signal level ranges can be defined as −4 dB to plus 4 dB. As these examples illustrate, a variety of different signal level ranges and cutoff frequencies can be used. Accordingly, in other embodiments, other signal level ranges can be defined.

At operation 1036, the system increases the gain of the other one of the frequency bands identified in the analysis operation 1032. In some embodiments, the amount of gain added is an amount sufficient to increase the signal level of that frequency band by an amount sufficient to raise the signal level to the average signal level of the content (or the average signal level of the content without the channel being operated on or without the two below-average channels). In other embodiments, the amount of gain added is an amount sufficient to bring the signal level of that frequency component to within the range of signal levels of the other frequency components. For example, the signal level can be brought to a level at or near the level of the highest signal-level frequency component. In still other embodiments, the amount of gain added is an amount sufficient to bring the signal level to a predetermined value or to within a predetermined signal level range.

In applications where there are one or more additional frequency bands having a signal level below a determined threshold, the system can be configured to analyze the one or more additional frequency bands, and increase the signal level of each accordingly.

At operation 1038 the analysis and gain amplification process is performed for the right (or second) channel. In some embodiments, the gains are applied to the same frequency bands to which gain was applied for the left (or first) channel. In other embodiments, the frequency bands are independently analyzed for the second channel. For example, a similar analysis can be applied to the second channel where frequency bands below a desired threshold are identified for the application of gain.

In various embodiments, the gains applied to each frequency band in the second channel can be the same amount of gain applied to same frequency bands in the first channel. That is, the amount of gain applied in each channel is sufficient to bring that frequency band to the same level, or closely within the same range of signal levels on both channels. In other embodiments, the gains applied to each frequency band are independently calculated and applied for the multiple channels. In one exemplary embodiment, the gain applied to each frequency band in the second channel is applied to bring the signal level to a lower level than the gained signal level of the same corresponding frequency band in the first channel.

In another exemplary embodiment, the gain applied to a first frequency band in the second channel is applied to bring the signal level to a lower level than the gained signal level of the same corresponding frequency band in the first channel, while the gain applied to a second frequency band in the second channel is applied to bring the signal level to a higher level than the gained signal level of the same corresponding frequency band in the first channel. Thus, one component, for example the low frequency range, is brought to a higher signal level in the first channel relative to the second channel, and a second component, for example, the high frequency component, is brought to a lower signal level in the first channel relative to the second channel. This complementary treatment of the high and low channels can improve the spatial properties of the audio program. The amount by which one channel is gained lower than the other channel can be varied based on the results desired. However, in some embodiments, the differential is approximately 3 dB. In other embodiments, the differential can be within a range of 0.5 to 4 dB. In still other embodiments, the amount of differential depends on the magnitude of the signal level on the channels or on the amount of gain applied to bring the first channel to above threshold. In yet other embodiments, the differential is defined by the spread of the endpoints in the signal level range.

In applications where there are more than two channels, the above process can be applied to each of the remaining channels. This is illustrated by operation 1042. Although the application to the left, right and any subsequent channels is illustrated as being performed in serial, the analysis and gain operations can be performed in parallel for the plurality of channels.

At operation 1046, the audio content on the left channel is phase shifted relative to the audio content on the right channel. The phase shift can be across the entire frequency range of the audio channel, or it can be applied to one or more frequency bands in the channel. For example, in one embodiment, the phase shift is applied only to low or lower frequency components. In other embodiments, the phase shift is applied to the entire channel. Where additional channels are present, the channels can be grouped in pairs and the audio content in each pair phase shifted in one channel relative to the other channel within that pair.

The above process creates modified channels—e.g., modified left and modified right channels in a two-channel system. At operation 1049, the modified right channel and the modified left channel are input into a master channel. In some embodiments, the master channel processes the signal to increase side-to-side depth of the signal by adding gains, compression, gating, threshold, range attack and release times. In various embodiments, compression is applied to increase lower amplitude signals and to suppress higher amplitude signals. In one embodiment, the master channel maintains the integrity of the left and right channels, but operates on these two channels together. In other words, the process preferably applies the same effects to both the left and right channels.

An example process for the master channel processing according to one embodiment is now described. For the low frequency signals, the gain is set to bring the signal to within a range between of between +2 to +7 dB; however, other signal level ranges can be used. To keep the low frequency signal within a fairly constant range, the signal level of the low frequency band is then held within a predetermined range. For example, in one embodiment, it is controlled by the processor so that it cannot dip more than 12 dB below the top of the gain range. For example, if the low frequency gain is applied to bring the signal to +7 dB, the processor will not allow the low frequency band to dip to a signal level below minus 5 dB.

In some embodiments, audio compression is also performed on the low frequency. For example, in one embodiment, the audio compressor attack is set within a range of 50 to 70 milliseconds; and the audio compressor release is set within a range of 30 to 55 milliseconds.

For Mid frequency signals, in some embodiments, the gain is set to bring the signal within a range between +1 to +3 dB, however, other signal level ranges can be used. To keep the low frequency signal within a fairly constant range, the mid frequency band is then held in a predetermined dB range. For example, in one embodiment, it is controlled by the processor so that it cannot dip more than 12 dB below the top of the gain range. For example, if gain is added to the mid frequency to bring it to +3 dB, the output of the processor will not dip below minus 9 dB.

In some embodiments, audio compression is also performed on the mid frequency. For example, in one embodiment, the audio compressor is set within range of 40 to 65 milliseconds; and the audio compressor release is set within range of 05 to 45 milliseconds.

For high frequency signals, in some embodiments, the gain is set to bring the signal within a range between +2 to +7 dB, however, other signal level ranges can be used. To keep the low frequency signal within a fairly constant range, the high frequency band is then held in a predetermined dB range. For example, in one embodiment, it is controlled by the processor so that it cannot dip more than 12 dB below the top of the gain range. For example if gain is added to the mid frequency to bring it to +7 dB, the processor will not allow it to dip below minus 5 dB.

In some embodiments, audio compression is also performed on the mid frequency. For example, in one embodiment, the audio compressor attack is set within range of 10 to 30 milliseconds; and the audio compressor release is set within range of 00 to 10 milliseconds.

The crossover is configured, in various embodiments with cutoff frequency settings of 75 Hz for low frequency, 653 Hz for mid frequency and 8.789 kHz for high frequency, with a Q at 0.75. The crossover is simply set at the point where the low frequencies cross and intersect with the mid frequencies, and where the mid frequencies cross and meet with the high frequencies. In one embodiment, the overall output is 0 dB, and the modified right input channel and the modified left input channel are set to 0 dB.

Attack and release times can be adjusted differently for different sound events. For example, for fast attack components like $16^{th}$ notes, or high-hast symbol hits, it is preferred to have a slower release. Making the release times too quick for fast attack components can make the content sound quick or jerky. For longer duration components, it is preferred to have a faster release.

In some embodiments, enhanced file size compression can be accomplished in conjunction with the multichannel processing described herein. For example, in some embodiments the multichannel processing can be applied to enhance an audio file that has already been compressed using a compression standard such as, for example, MP3. After applying the multichannel processing described herein, the file can then be compressed again using a compression algorithm (e.g., MP3 again). Because the multichannel processing described herein can enhance the sound without added data back into the system, the content can tolerate the second compression without undue loss.

In various embodiments, the audio processing techniques discussed herein can be applied to a file (whether or not already compressed) to enhance the content for playback. However, in further embodiments, the processing techniques can be applied in such a manner so as to compensate for anticipated compression in advance of the file being compressed. Accordingly, for example, if it is known that a compression algorithm to be applied tends to have a greater adverse effect on a particular frequency band or bands, the processing that might otherwise be applied can be increased for that particular frequency band or bands to compensate for the anticipated effects of the compression. Accordingly, even if the file being processed according to the systems and methods set forth herein was previously compressed, the processing can not only help to compensate for the prior compression, but it can also be implemented to overcompensate in anticipation of further compression.

Various embodiments can be provided to process audio content including speech components. Particularly, various embodiments can be provided to enhance speech qualities in an audio recording or in a live audio stream via processing that is different from the embodiments described above.

In various embodiments, and frequencies associated with human speech are notched out using a gate or bandpass filter. Additionally, where known sources of noise reside at particular frequency levels, those sources can be filtered out. For example, where the emphasis is on the human voice, gating or equalization can be used to enhance the middle frequencies where the voice typically resides. Additionally, compression can be applied to amplify the lower amplitude signals and suppress the higher amplitude frequencies.

In other embodiments, such as applications where the speech is captured by a person talking on a cellular telephone or other like device, the process can be implemented to amplify the frequency band in which the highest energy sounds are occurring relative to the other frequency bands. Likewise, the other frequency bands can be suppressed. Such embodiments can be beneficial in various speech applications including cellular telephony applications where a user typically is speaking with his or her mouth in close proximity to the microphone. In such applications, the voice signal tends to have a higher energy than the background noise due to the proximity of the source to the microphone. Accordingly, amplifying the frequency ranges in which the higher energy levels are occurring, and not amplifying, or even suppressing, the other frequency ranges, can improve the quality of speech picked up by the device. Measurement of energy levels can be detected instantaneously, or over a given time interval. Looking at average energy levels for various frequency bands over a predetermined time interval may provide the benefit of not triggering amplification for sporadic high-energy bursts of background noise, while allowing amplification of an ongoing stream of speech. Additionally, detecting gaps in speech, such as by detecting gaps in the corresponding frequency bands, can allow the system to cut out the microphone's vox or 'mute' the microphone. In this way, when a first caller is listening to another caller and not talking, background noise in the first caller's environment will not interfere with the call.

Accordingly, various embodiments process the signal generated by the device microphone. For example, the microphone could be a condenser microphone, dynamic microphone, piezoelectric microphone or other microphone used to capture voice. The device could be, for example, a cellular telephone, two-way radio, audio recording device or other voice capture or communications device. The process can be implemented so as to filter out background noise, limit loudness (or over modulation from a voice), "expand" the voice and overall sound, and apply broadcast audio techniques that will make a voice sound better, clearer and crisper, which enables transmission in a very narrow field.

In some embodiments, the process is implemented to turn down the level of input of the microphone signal. Because, as noted above, the device will generally be in close proximity to the user, the process can be configured to accept or even amplify higher signal levels and diminish or null lower signal level inputs. Again, measurement of energy levels can be determined instantaneously, or over a given time interval. After this speech processing is performed, the audio content can be processed by the device in its usual fashion. For example, for radio transmission, the processed signal can be modulated onto a carrier for transmission. In the case of a cellular telephone or other like device, the processed signal can be provided to the device's processor for encoding and transmission according to the device standard. These embodiments may work well for applications in which the user is speaking into the microphone from a close distance—e.g., approximately less than 1 inch, to 6 or 9 inches. These embodiments may also work well for speakerphone applications where the user is speaking from a farther distance.

However, in some embodiments, an additional or alternative process can be applied for speakerphone applications. When a device is in speakerphone mode, the microphone (condenser or otherwise) is typically set to be more sensitive than in non-hands-free mode. This enables the microphone to capture the input from a greater distance. In some embodiments, for speakerphone applications the process gains the voice signal generated by the condenser microphone when the device is in speakerphone mode. The processing described above for non-speakerphone mode can be applied to this mode to better separate the voice and enhance it above the noise. Additionally, the process can be configured to add audio compression/limiting to increase low signal level components and soften high signal level output at the device speaker level. The process can also be configured to gain the output of the device speakers (but not necessarily the earpiece speaker).

In various embodiments, the systems and methods described herein can be implemented in a number of devices including, for example, cellular telephones, smart phones, MP3 players and other media players, tablet computing devices, laptop and notebook computers, personal computers, two-way radios, hearing aids and assisted listening devices, and other devices for communicating or playing audio content. In some embodiments, the systems and methods described herein can be implemented as an application configured to run on a dedicated processor, a processor or processors used by the device with which the application is implemented, or a combination thereof. In the case of an application, the application can be configured with the appropriate user interfaces to allow the user to control setpoints and features of the process to adjust the process for a particular environment, or to adjust the process to his or her liking. Additionally, in various embodiments the application can be configured to sense various states of the device in which it is running, and to configure itself for operation in accordance with those states.

Figure 12:
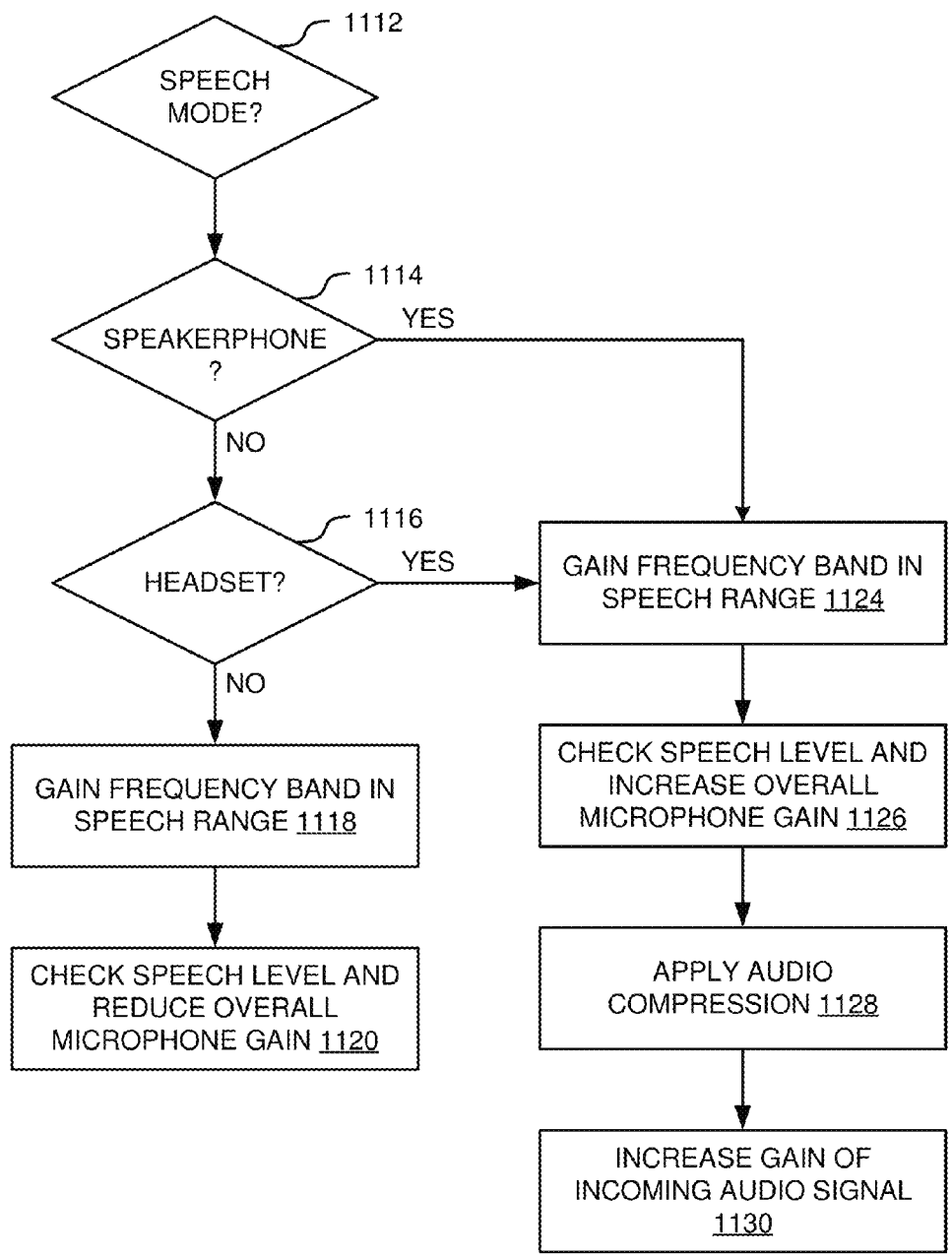
FIG. 12 is a flow diagram illustrating an example operation of the process in a device in accordance with a voice processing embodiment of the systems and methods described herein.

FIG. 12 is a flow diagram illustrating an example operation of the process in a device in accordance with one embodiment of the systems and methods described herein. Referring to FIG. 12, this example process is now described. At operation 1112, the process checks to determine whether the device is in a speech mode. For example, the device may be a smart phone or other like device, and the process can check the state of the smart phone to determine whether it is in a mode to make a telephone call, capture a voice recording, or other like speech-related mode. If so, the process continues at operation 1114 and determines whether or not the device is in a hands-free mode (e.g., a speakerphone mode). If not, the process determines at operation 1116 whether or not the device is configured for use with a headset. This can be accomplished by checking either the headphone jack status (i.e. whether or not a headphone is plugged in) or by checking the Bluetooth connectivity status to determine whether a Bluetooth headset is linked to the device and actively used for a telephone call or other ongoing event.

If the device is not in headset mode or hands-free mode the process continues at operation 1118 in which signal levels in the frequency band or bands corresponding to speech frequencies are increased, or gained, relative to the other frequency bands. As described above, bandpass filters or gates can be used to pass the desired frequency bands while suppressing the other frequency bands. Also, combinations of bandpass filters and gain stages can be used to gain the desired frequency bands relative to the other frequency bands.

At operation 1120, the process checks the signal level for the desired frequency bands to determine whether they are at a sufficient level. If the desired frequency bands (i.e. the frequency bands in which the speech content resides) are above a predetermined threshold, the process can reduce the overall microphone gain. This can be advantageous in at least two ways. First, it can avoid clipping or over driving subsequent processes in the desired frequency bands. Second, it can have the effect of reducing the background noise level as well.

If the device is in either hands-free mode or headset mode, alternative processing optimized for those modes can be implemented. Depending on the hands-free setup for the type of hands-free headset used, processing may vary. However, because some of the characteristics of hands-free mode and the headset mode are similar, such as an increased distance of the microphone from the speaker, similar processing can be applied to both modes. This is the scenario that is illustrated in FIG. 12. With continued reference to FIG. 12, when the device is operating in either the speakerphone mode or the headset mode, at operation 1124 the process gains the frequency bands corresponding to the speech content relative to the other frequency bands. This can be similar to the process followed at operation 1118. For example, signal levels in the frequency band or bands corresponding to speech frequencies are increased, or gained, relative to the other frequency bands. As described above, bandpass filters or gates can be used to pass the desired frequency bands while suppressing the other frequency bands. Also, combinations of bandpass filters and gain stages can be used to gain the desired frequency bands relative to the other frequency bands.

Because operations in speakerphone mode or with headsets can suffer from an increased distance between the microphone and the speaker's mouth, the process can be configured to check the speech level and increase the overall microphone gain where the speech level is below a desired signal level even after the processing performed at operation 1124. This is illustrated at operation 1126. However, with some headsets, the microphone may be closer to the caller's mouth than the telephone's microphone would be in speakerphone mode. Accordingly, in some embodiments, this operation 1126 is eliminated for the headset mode, or, alternatively, the overall microphone gain can be decreased as it was in non-hands-free mode. In other embodiments, for the speech level is checked and it is above a desired signal level, the process can be configured to decrease the overall microphone gain.

At operation 1128, the process can be configured to apply audio compression to the process signal. For example, audio compression can be applied to boost portions of the content at low signal levels and limit portions of the content at high signal levels. Also, because hands-free operation can tend to lead to hearing difficulties, especially in the speakerphone mode, the process can be configured to increase the signal level of the audio signal provided to the devices speaker(s), to enhance the user's ability to hear the incoming audio content.

As described above, the process can be implemented to detect the state of the device with which it is integrated to provide at least a baseline level of audio processing tailored to the device state. Accordingly, by detecting the device state, the process can determine whether it is being called on to process audio content from the microphone, from an MP3 file, from a hands-free microphone, and so on. Likewise, the process can also be configured to determine the likely content to be processed. For example, if the device is in a telephone mode the process can be configured to setup for speech processing versus music processing. On the other hand, if it is detected that the device is in an MP3 playback mode, the process can be configured for music processing of a two channel audio. Furthermore, detecting whether headphones are plugged in to the device while in an MP3 playback mode, for example, may allow further tailoring of the audio content processing for headphone playback versus device speaker playback.

Figure 13:
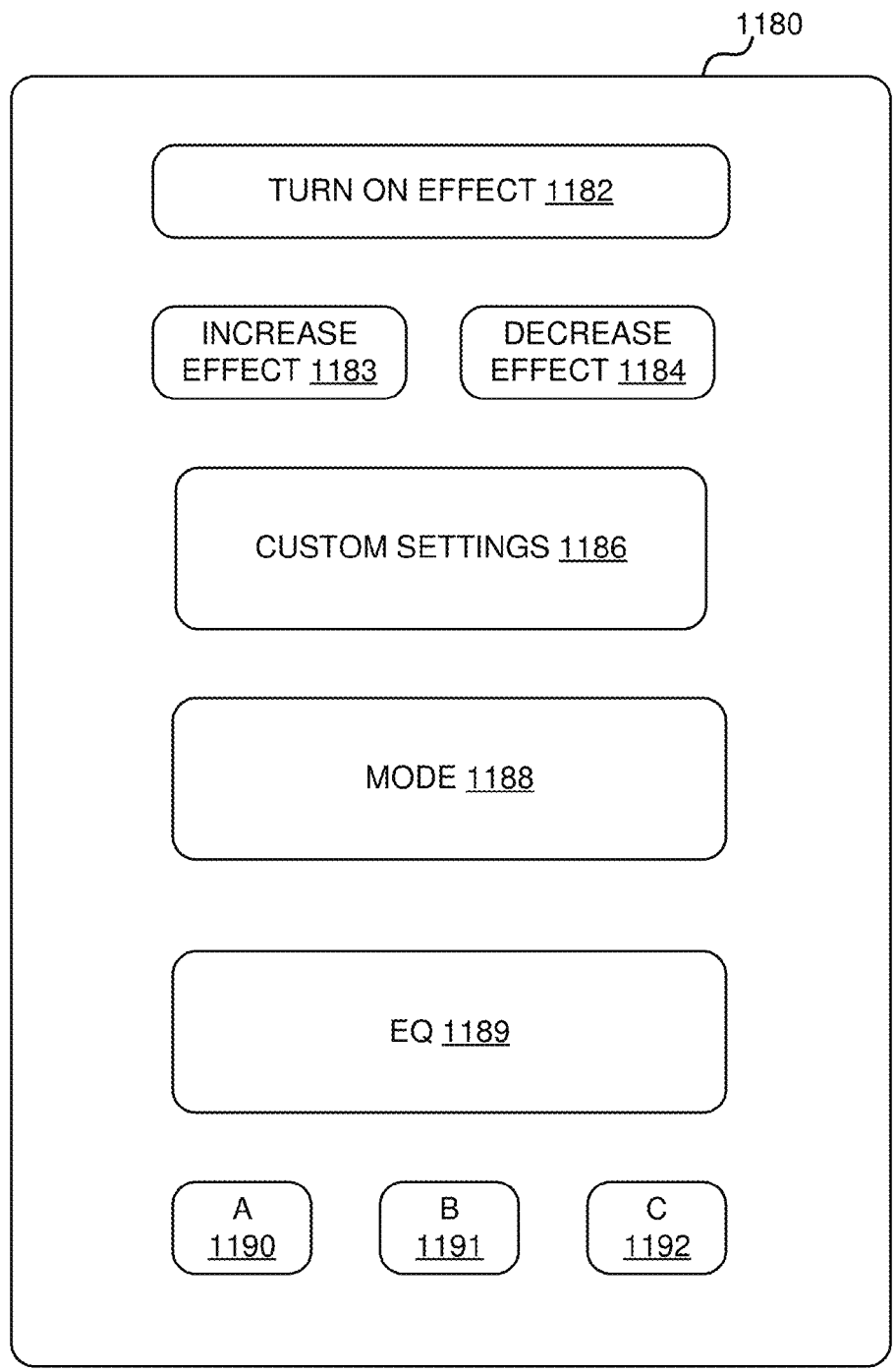
FIG. 13 is a diagram illustrating one example of a user interface that can be provided for operation of the process in accordance with one embodiment of the systems and methods described herein.

FIG. 13 is a diagram illustrating one example of a user interface that can be provided for operation of the process in accordance with one embodiment of the systems and methods described herein. Referring now to FIG. 13, illustrated is a screenshot 1180 of the example user interface. In this example, multiple touch screen buttons are provided to allow the user to control the effects of the process, or to open additional GUIs to reach the ability to control additional settings. For example, button 1182 can be included to allow the user to turn the effects on or off. In automatic mode, turning the effect on can allow the process to determine the state of the device and the content to be processed, and it can apply the appropriate processing for that content. Accordingly, a one-touch operation can be provided.

Buttons 1183, 1184 can be provided to allow the user with one touch operation to increase or decrease the effects of the processing being applied. For example, for multichannel music processing (e.g. the embodiments of FIGS. 1 through 11), increasing or decreasing the effect may serve to increase or decrease the level of gain and phase shift applied to each of the channels or the level of master channel processing applied. Likewise, for speech processing embodiments, increase or decrease effect buttons 1183, 1184 may be implemented such that they increase or decrease the amount of relative gain applied to the frequency bands of interest or to otherwise adjust the amount of effect provided.

Button 1186 can be included to allow the user to access one or more subsequent screens that allow the user to apply and adjust custom settings for the process. Selecting the custom settings function 1186 will bring the user to subsequent screens, which, in some embodiments, can be configured to allow the user to adjust any or all of the various parameters and variables described above such as, for example, the amounts of gain applied to a given channels, gain ranges and thresholds for the various channels, cutoff points for the various frequency bands, numbers of frequency bands, attack and release time allowable adjustment ranges, and so on. Accordingly, the user can be given the ability to manually control the process or to adjust the setpoints used by the automated process.

Mode button 1188 can be provided to allow the user to access and select a number of predefined modes. For example, the user may be able to save custom settings as a particular mode, which can be selected through the mode button 1188. As another example, mode buttons for speakerphone mode, headset mode, speech mode and so on can be provided to allow the user to cause the process to enter a given mode manually, resulting in selection of process parameters for the selected modes.

An equalizer button 1189 can be included to allow the user to access a custom equalizer so that the user can make additional settings or modifications to the signal levels in the various frequency bands. Similarly, although not illustrated, the user may also be permitted to access other adjustable process parameters. Buttons 1190, 1191, 1192 can be provided as quick feature access buttons to allow one touch configuration of particular process-defined settings or user-defined settings.

In addition to the GUIs described herein, the application can be configured to allow individual buttons or sets of buttons to be placed on other screens of the device for quick access without the need to open an application-specific GUI for the process. For example, any of the functions associated with the buttons described with reference to FIG. 13 be provided as quick access buttons on other application screens or home screens. For example, a "noise" button can be included either on the GUI, or on other screens, or both, to allow the user quick selection of a noise reduction mode when the user is in a noisy environment. When the user in the noisy environment selects the noise button, the system can be configured to enter the speech-processing mode to enhance the speech content over the noise. In embodiments where the process is configured to automatically enter this mode when the device is in the speech mode, the noise button can be configured to enhance the speech processing effects. In some embodiments, the process, including GUI features are implemented on the device receiving a telephone call as well as a device placing the telephone call. Accordingly, enhancement may be applied at one or both ends of a two-way communication.

The term tool can be used to refer to any apparatus configured to perform a recited function. For example, tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

Figure 14:
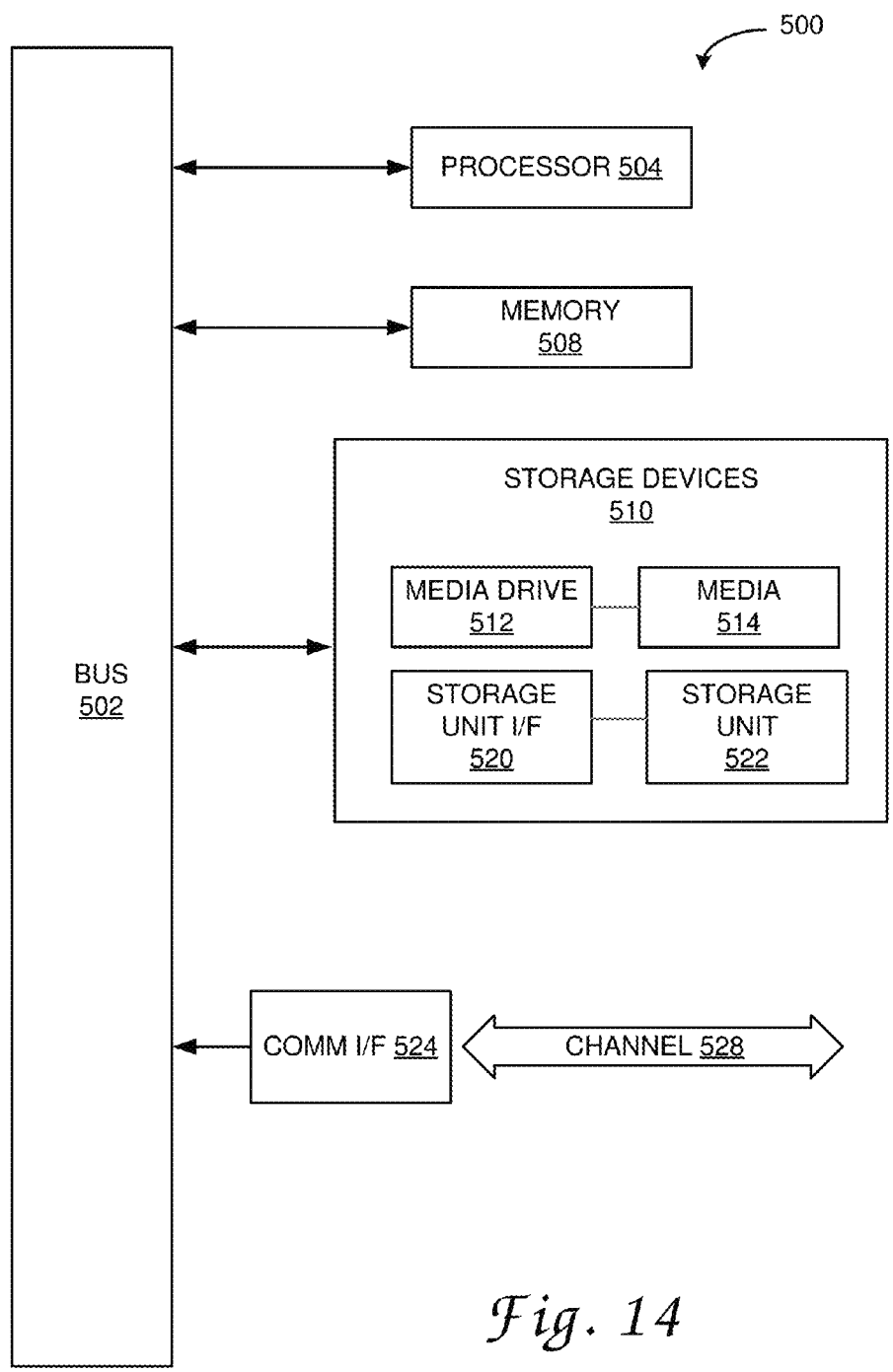
FIG. 14 illustrates an example computing module that may be used in implementing various features of embodiments of the systems and methods described herein.

As used herein, the term module might describe a given unit of functionality that can be performed in accordance with one or more embodiments of the present invention. As used herein, a module might be implemented utilizing any form of hardware, software, or a combination thereof. For example, one or more processors, controllers, DSPs, ASICs, PLAs, PALs, CPLDs, FPGAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the invention are implemented in whole or in part using software, in one embodiment, these software elements can be implemented to operate with a computing or processing module capable of carrying out the functionality described with respect thereto. One such example computing module is shown in FIG. 14. Various embodiments are described in terms of this example-computing module 1100. After reading this description, it will become apparent to a person skilled in the relevant art how to implement the invention using other computing modules or architectures.

Referring now to FIG. 14, computing module 1100 may represent, for example, computing or processing capabilities found within desktop, laptop and notebook computers; hand-held computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 1100 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 1100 might include, for example, one or more processors, controllers, control modules, or other processing devices, such as a processor 1104. Processor 1104 might be implemented using a general-purpose or special-purpose processing engine such as, for example, a microprocessor, controller, or other control logic. In the illustrated example, processor 1104 is connected to a bus 1102, although any communication medium can be used to facilitate interaction with other components of computing module 1100 or to communicate externally.

Computing module 1100 might also include one or more memory modules, simply referred to herein as main memory 1108. For example, preferably random access memory (RAM) or other dynamic memory might be used for storing information and instructions to be executed by processor 1104. Main memory 1108 might also be used for storing temporary variables or other intermediate information during execution of instructions to be executed by processor 1104. Computing module 1100 might likewise include a read only memory ("ROM") or other static storage device coupled to bus 1102 for storing static information and instructions for processor 1104.

The computing module 1100 might also include one or more various forms of information storage mechanism 1110, which might include, for example, a media drive 1112 and a storage unit interface 1120. The media drive 1112 might include a drive or other mechanism to support fixed or removable storage media 1114. For example, a hard disk drive, a floppy disk drive, a magnetic tape drive, an optical disk drive, a CD or DVD drive (R or RW), or other removable or fixed media drive might be provided. Accordingly, storage media 1114 might include, for example, a hard disk, a floppy disk, magnetic tape, cartridge, optical disk, a CD or DVD, or other fixed or removable medium that is read by, written to or accessed by media drive 1112. As these examples illustrate, the storage media 1114 can include a computer usable storage medium having stored therein computer software or data.

In alternative embodiments, information storage mechanism 1110 might include other similar instrumentalities for allowing computer programs or other instructions or data to be loaded into computing module 1100. Such instrumentalities might include, for example, a fixed or removable storage unit 1122 and an interface 1120. Examples of such storage units 1122 and interfaces 1120 can include a program cartridge and cartridge interface, a removable memory (for example, a flash memory or other removable memory module) and memory slot, a PCMCIA slot and card, and other fixed or removable storage units 1122 and interfaces 1120 that allow software and data to be transferred from the storage unit 1122 to computing module 1100.

Computing module 1100 might also include a communications interface 1124. Communications interface 1124 might be used to allow software and data to be transferred between computing module 1100 and external devices. Examples of communications interface 1124 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 1124 might typically be carried on signals, which can be electronic, electromagnetic (which includes optical) or other signals capable of being exchanged by a given communications interface 1124. These signals might be provided to communications interface 1124 via a channel 1128. This channel 1128 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 1108, storage unit 1120, media 1114, and channel 1128. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 1100 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A method for modifying audio content on an electronic device, the method comprising:
   detecting an audio mode in which the electronic device is operating to determine a type of audio content processing to apply to audio content based on the detected audio mode, wherein the type of audio content processing comprises speech processing when the electronic device is detected to be in a speech-related audio mode, and music processing when the electronic device is detected to be in a playback audio mode;
   if the detected audio mode is a speech-related audio mode, receiving a speech signal from a speech source; and
   processing the speech signal to improve a perceived quality of the speech at a recipient;
   wherein processing the speech signal to improve the perceived quality of the speech comprises:
   decreasing a signal level of audio content outside of a determined frequency band relative to a signal level of audio content within the determined frequency band; and
   adjusting attack and release times of the speech signal based on sound events within the speech signal, wherein the attack is associated with very high frequency sounds which are not phase shifted; and
   wherein the determined frequency band is a frequency band associated with a vocal range of an anticipated speech content.

2. The method of claim 1, wherein decreasing the signal level of audio content outside of a determined frequency band relative to the signal level of audio content within the determined frequency band comprises amplifying the signal level of audio content within the determined frequency band.

3. The method of claim 1, wherein decreasing the signal level of audio content outside of a determined frequency band relative to the signal level of audio content within the determined frequency band comprises filtering the signal level of audio content outside the determined frequency band.

4. The method of claim 1, wherein decreasing the signal level of audio content outside of a determined frequency band relative to the signal level of audio content within the determined frequency band comprises amplifying the signal level of audio content within the determined frequency band and filtering the signal level of audio content outside the determined frequency band.

5. A method for modifying audio content on an electronic device, the method comprising:
   detecting an audio mode in which the electronic device is operating to determine a type of audio content processing to apply to audio content, wherein the type of audio content processing comprises speech processing when the electronic device is detected to be in a speech-related audio mode, and music processing when the electronic device is detected to be in a playback audio mode;
   receiving a speech signal from a speech source;
   if the detected mode is a speech-related audio mode, detecting a speech source mode of the electronic device based on the speech source, wherein the speech source mode comprises a speakerphone mode or a telephone mode;

processing the speech signal to improve a perceived quality of the speech at a recipient, wherein:

the processing includes adjusting attack and release times of the speech signal based on sound events within the speech signal, wherein the attack is associated with very high frequency sounds which are not phase shifted; and the processing is configured based on the detected speech source mode of the device.

6. The method of claim 5, wherein processing the speech signal to improve the perceived quality of the speech comprises gating the signal to decrease a signal level of audio content outside a determined frequency band relative to a signal level of audio content within the determined frequency band.

7. The method of claim 6, wherein the determined frequency band is a frequency band associated with a human vocal range.

8. The method of claim 6, wherein the determined frequency band is a frequency band associated with a vocal range of an anticipated speech content.

9. The method of claim 6, wherein the determined frequency band is a frequency band from approximately 300 Hz to 3400 Hz.

10. The method of claim 6, wherein gating the signal to decrease the signal level of audio content outside of a determined frequency band relative to the signal level of audio content within the determined frequency band comprises amplifying the signal level of audio content within the determined frequency band.

11. The method of claim 6, wherein gating the signal to decrease the signal level of audio content outside of a determined frequency band relative to the signal level of audio content within the determined frequency band comprises filtering the signal level of audio content outside the determined frequency band.

12. The method of claim 6, wherein gating the signal to decrease the signal level of audio content outside of a determined frequency band relative to the signal level of audio content within the determined frequency band comprises amplifying the signal level of audio content within the determined frequency band and filtering the signal level of audio content outside the determined frequency band.

13. The method of claim 6, wherein processing the speech further comprises applying compression to the signal.

14. The method of claim 5, further comprising when the speech source mode detected indicates that the device is in a telephone mode, determining whether the device is in a hands-free mode or a non-hands-free mode.

15. The method of claim 14, wherein, if the electronic device is in a non-hands-free mode, reducing the signal level of an audio signal from a microphone of the device.

16. The method of claim 5, wherein the speech source mode detected indicates that the device is in a speakerphone mode, amplifying the signal level of an audio signal from a microphone of the device.

17. A multi-mode electronic device comprising:

memory coupled to a processor and storing instructions that, when executed by said processor, cause the processor to perform operations of;

detecting an audio mode in which the multi-mode electronic device is operating to determine a type of audio content processing to apply to audio content, wherein the type of audio content processing comprises speech processing when the multi-mode electronic device is detected to be in a speech-related audio mode, and music processing when the electronic device is detected to be in a playback audio mode;

receiving a speech signal from a speech source;

if the detected mode is a speech-related mode, detecting a speech source mode of the multi-mode electronic device based on the speech source, wherein a speech source mode comprises a speakerphone mode or a telephone mode;

processing the speech signal to improve perceived quality of the speech at a recipient, wherein:

the processing includes adjusting attack and release times of the speech signal based on sound events within the speech signal, wherein the attack is associated with very high frequency sounds which are not phase shifted; and the processing is configured based on the detected speech-source mode of the device.

18. The multi-mode electronic device of claim 17, wherein processing the speech signal to improve the perceived quality of the speech comprises, decreasing a signal level of audio content outside of a determined frequency band relative to a signal level of audio content within the determined frequency band.

19. The multi-mode electronic device of claim 18, wherein the determined frequency band is a frequency band associated a vocal range of an anticipated speech content.

20. The multi-mode electronic device of claim 18, wherein the multi-mode electronic device comprises a smart phone.

21. The multi-mode electronic device of claim 18, wherein the multi-mode electronic device comprises a two-way radio, tablet computer, PC, or speech-recording device.

* * * * *